(12) United States Patent
Wen et al.

(10) Patent No.: US 12,456,955 B2
(45) Date of Patent: Oct. 28, 2025

(54) PUSH-PULL RADIO FREQUENCY POWER AMPLIFIER AND METHOD FOR CONTROLLING CIRCUIT

(71) Applicant: SMARTER MICROELECTRONICS (GUANG ZHOU) CO., LTD., Guangzhou (CN)

(72) Inventors: Huadong Wen, Guangzhou (CN); Dajie Dai, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 582 days.

(21) Appl. No.: 17/929,729

(22) Filed: Sep. 5, 2022

(65) Prior Publication Data

US 2022/0416739 A1 Dec. 29, 2022

Related U.S. Application Data

(63) Continuation of application No. PCT/CN2021/132161, filed on Nov. 22, 2021.

(30) Foreign Application Priority Data

Jan. 29, 2021 (CN) .......................... 202110129749.6

(51) Int. Cl.
*H03F 3/26* (2006.01)
*H03F 1/30* (2006.01)
*H03F 3/24* (2006.01)

(52) U.S. Cl.
CPC ............... *H03F 3/26* (2013.01); *H03F 1/308* (2013.01); *H03F 3/245* (2013.01);
(Continued)

(58) Field of Classification Search
CPC . H03F 3/26; H03F 1/308; H03F 3/245; H03F 2200/117; H03F 2200/451;
(Continued)

(56) References Cited

U.S. PATENT DOCUMENTS 3,399,277 A 8/1968 William et al.
3,417,339 A 12/1968 Sondermeyer
(Continued)

FOREIGN PATENT DOCUMENTS

| CN | 111628740 A | 9/2020 |
|----|-------------|--------|
| CN | 112448683 A | 3/2021 |
| GB | 811766 A | 4/1959 |

OTHER PUBLICATIONS

International Search Report in Application No. PCT/CN2021/132161, mailed on Feb. 10, 2022.
(Continued)

*Primary Examiner* — Hieu P Nguyen
(74) *Attorney, Agent, or Firm* — SYNCODA LLC; Feng Ma

(57) ABSTRACT

A push-pull radio frequency power amplifier includes a coupling feedback circuit, a drive stage circuit and a power output stage circuit, in which the coupling feedback circuit is connected with the drive stage circuit and/or the power output stage circuit; the coupling feedback circuit is configured to generate an alternating voltage at an input end of a first transistor and/or an input end of a push-pull transistor; when the alternating voltage and a voltage at the input end are in a same direction, a positive feedback of an input signal at the input end is achieved; and the first transistor represents a transistor in the drive stage circuit and the push-pull transistor represents a second transistor and a third transistor that form a push-pull structure in the power output stage circuit.

13 Claims, 22 Drawing Sheets

(52) U.S. Cl.
CPC .. *H03F 2200/117* (2013.01); *H03F 2200/451* (2013.01); *H03F 2200/541* (2013.01)

(58) Field of Classification Search
CPC ............. H03F 2200/541; H03F 1/0205; H03F 2200/411; H03F 2200/537; H03F 3/265
USPC ......................................... 330/301, 310, 265
See application file for complete search history.

(56) References Cited

U.S. PATENT DOCUMENTS

| | | | | |
|---|---|---|---|---|
| 5,963,443 | A * | 10/1999 | Mihara | ............... H02M 7/5381 |
| | | | | 363/133 |
| 2021/0391835 | A1* | 12/2021 | Kazuno | ..................... H03F 3/26 |
| 2022/0376733 | A1* | 11/2022 | Datta | ........................ H03F 3/26 |
| 2023/0104305 | A1* | 4/2023 | Lyalin | ....................... H03F 3/26 |
| | | | | 455/73 |

OTHER PUBLICATIONS

Written opinion in Application No. PCT/CN2021/132161, mailed on Feb. 10, 2022.
China first office action in Application No. 202110129749.6, mailed on Mar. 18, 2021.

* cited by examiner

FIG. 2G　　　　　　　FIG. 2H

PUSH-PULL RADIO FREQUENCY POWER AMPLIFIER AND METHOD FOR CONTROLLING CIRCUIT

CROSS-REFERENCE TO RELATED APPLICATIONS

This is a continuation of International Application No. PCT/CN2021/132161 filed on Nov. 22, 2021, which claims priority to Chinese Patent Application No. 202110129749.6 filed on Jan. 29, 2021. The disclosures of the above-referenced applications are hereby incorporated by reference in their entirety.

BACKGROUND

Mobile communication technologies have evolved to the fifth generation (5G). As a global 5G standard of new air interface design based on orthogonal frequency division multiplexing (OFDM), the 5th-Generation New Radio (5G NR) is also a very important cellular mobile technology foundation for the next generation. The 3rd Generation Partnership Project (3GPP) defines the frequency range of 5G NR from Frequency Range 1 (FR1) (450 MHz-6000 MHz) to Frequency Range 2 (FR2) (24250 MHz-52600 MHz). Because the transmission attenuation of electromagnetic waves in the air increases significantly with the increase in frequency, when 5G NR enters the sub 6 GHz and millimeter wave frequency bands, on the one hand, a communication equipment needs to provide greater transmission power to ensure signal transmission distance; on the other hand, higher data transmission rates require larger signal bandwidths and more complex modulation methods. These have put forward higher and higher technical requirements for radio frequency power amplifiers, including providing higher gain and output power in high frequency bands to ensure signal coverage and lower adjacent channel power ratio (ACPR) to minimize spectrum regeneration and maintain modulation accuracy, etc.

SUMMARY

The disclosure relates to wireless communication technologies, in particular to a push-pull radio frequency power amplifier and a method for controlling circuit.

The disclosure provides a push-pull radio frequency power amplifier including: a coupling feedback circuit, a drive stage circuit and a power output stage circuit; in which the coupling feedback circuit is connected with the drive stage circuit and/or the power output stage circuit;

in which, the coupling feedback circuit is configured to generate an alternating voltage at an input end of a first transistor and/or an input end of a push-pull transistor; when the alternating voltage and a voltage at the input end are in the same direction, a positive feedback of an input signal at the input end is achieved; the first transistor represents a transistor in the drive stage circuit and the push-pull transistor represents a second transistor and a third transistor that form a push-pull structure in the power output stage circuit.

In some embodiments, the drive stage circuit includes a first transformer;

when the first transistor is a heterojunction bipolar transistor (HBT), a primary coil of the first transformer is coupled with a secondary coil led out from a base of the first transistor to form a second transformer; the coupling feedback circuit includes the secondary coil led out from the base of the first transistor;

when the first transistor is a metal-oxide semiconductor field effect transistor (MOSFET), the primary coil of the first transformer is coupled with a secondary coil led out from a gate of the first transistor to form a second transformer; the coupling feedback circuit includes the secondary coil led out from the gate of the first transistor.

In some embodiments, a secondary coil of the second transformer is directly connected with a ground terminal;

or when the first transistor is the HBT, the secondary coil of the second transformer is connected with the ground terminal through an emitter of the first transistor;

or when the first transistor is the MOSFET, the secondary coil of the second transformer is connected with the ground terminal through a source of the first transistor.

In some embodiments, the power output stage circuit includes a third transformer;

when the second transistor and the third transistor are the HBTs, a primary coil of the third transformer is coupled with a secondary coil led out from a base of the second transistor to form a fourth transformer;

the primary coil of the third transformer is coupled with a secondary coil led out from a base of the third transistor to form a fifth transformer; and the coupling feedback circuit includes the secondary coil led out from the base of the second transistor and the secondary coil led out from the base of the third transistor;

when the second transistor and the third transistor are the MOSFETs, the primary coil of the third transformer is coupled with a secondary coil led out from a gate of the second transistor to form a fourth transformer;

the primary coil of the third transformer is coupled with a secondary coil led out by a gate of the third transistor to form a fifth transformer; and the coupling feedback circuit includes the secondary coil led out from the gate of the second transistor and the secondary coil led out from the gate of the third transistor.

In some embodiments, a secondary coil of the fourth transformer is connected with the ground terminal; or when the second transistor is the HBT, the secondary coil of the fourth transformer is connected with the ground terminal through an emitter of the second transistor;

or when the second transistor is the MOSFET, the secondary coil of the fourth transformer is connected with the ground terminal through a source of the second transistor;

a secondary coil of the fifth transformer is connected with the ground terminal directly;

or when the third transistor is the HBT, the secondary coil of the fifth transformer is connected with the ground terminal through an emitter of the third transistor;

or when the third transistor is the MOSFET, the secondary coil of the fourth transformer is connected with the ground terminal through a source of the third transistor.

In some embodiments, the coupling feedback circuit further includes: a feedback device;

one end of the feedback device is configured to receive the alternating voltage, and the other end of the feedback device is connected with the input end of the first transistor and/or the input end of the push-pull transistor.

In some embodiments, the feedback device is any of the following: a coupling feedback capacitor, a variable capacitor, a varactor diode, a resistor-diode series branch, a RC series branch, a resistor and a filter.

In some embodiments, the coupling feedback circuit is configured to generate the alternating voltage at the input of the first transistor and/or the input end of the push-pull transistor; when the alternating voltage and the voltage at the input end are in opposite directions, negative feedback of the input signal at the input end is achieved.

In some embodiments, when the coupling feedback circuit is connected with the drive stage circuit, the coupling feedback circuit and the drive stage circuit are located in different metal layers respectively to achieve interface coupling between surfaces of the different metal layers;

when the coupling feedback circuit is connected with the power output stage circuit, the coupling feedback circuit and the power output stage circuit are located in different metal layers respectively to achieve the interface coupling between the surfaces of the different metal layers.

Embodiments of the disclosure further provide a method for controlling circuit, which is applied in a push-pull radio frequency power amplifier including a coupling feedback circuit, a drive stage circuit and a power output stage circuit, in which the coupling feedback circuit is connected with the driving stage circuit and/or the power output stage circuit, in which, the method includes:

generating an alternating voltage at an input end of a first transistor and/or an input end of a push-pull transistor; when the alternating voltage and a voltage at the input end are in the same direction, positive feedback of an input signal at the input end is achieved; the first transistor represents a transistor in the drive stage circuit and the push-pull transistor represents a second transistor and a third transistor that form a push-pull structure in the power output stage circuit.

Embodiments of the disclosure provide the push-pull radio frequency power amplifier and the method for controlling circuits. The push-pull radio frequency power amplifier includes: a coupling feedback circuit, a drive stage circuit and a power output stage circuit, in which the coupling feedback circuit is connected with the drive stage circuit and/or the power output stage circuit; in which, the coupling feedback circuit is configured to generate alternating voltage at an input end of a first transistor and/or an input end of a push-pull transistor; when the alternating voltage and a voltage at the input end are in the same direction, a positive feedback of an input signal at the input end is achieved; the first transistor represents a transistor in the drive stage circuit and the push-pull transistor represents a second transistor and a third transistor that form a push-pull structure in the power output stage circuit. In this way, by the alternating voltage generated by the coupling feedback circuit, the positive feedback of the input signal from the output end to the input end is realized, and the in-phase superposition of the input signal is carried out according to the positive feedback of the input signal, thus effectively improving the signal strength of the input signal. As a result, without increasing the number of drive stages, the gain and the output power of the push-pull radio frequency power amplifier may be effectively improved, and the design complexity of the radio frequency power amplifier may be reduced.

BRIEF DESCRIPTION OF THE DRAWINGS

FIG. 2G is a first schematic diagram of the relationship between the induced voltage and the coil polarity generated by the electromagnetic coupling of an ideal transformer in some implementations;

FIG. 2H is a second schematic diagram of the relationship between the induced voltage and the coil polarity generated by the electromagnetic coupling of an ideal transformer in some implementations;

DETAILED DESCRIPTION

The disclosure is described in further detail below with reference to the accompanying drawings and embodiments.

It should be understood that the specific embodiments described herein are intended to explain the disclosure, but are not intended to limit the scope of the disclosure.

In some implementations, in order to provide sufficient gain, a push-pull radio frequency power amplifier needs to adopt a cascade design of a drive stage and a power output stage. However, the two-stage push-pull radio frequency power amplifier is limited by the upper limit of the gain of a single-stage transistor, and additionally in sub 6 GHz or even millimeter wave bands, the deterioration of the gain caused by the grounded inductor of the transistor and its own parasitic parameters will become more and more obvious, thereby resulting in the problem of insufficient gain margin becoming more and more serious. In addition, in order to achieve higher gain, it is necessary to add a driving amplifier in the two-stage push-pull radio frequency power amplifier, thereby increasing the design complexity of the radio frequency power amplifier.

Compared with non-synthesis single-ended radio frequency power amplifiers, typical push-pull radio frequency power amplifiers adopt two-way power differential synthesis technology, in which the impedance of the output load line is higher (about four times that of the single-ended) at the same output power, and it is relatively insensitive to the last-stage common-mode parasitic reactance. Therefore, the push-pull power amplifiers (Push-Pull PA) can provide higher gain and output power, and meanwhile has better suppression to dual subharmonics.

Figure 1A:
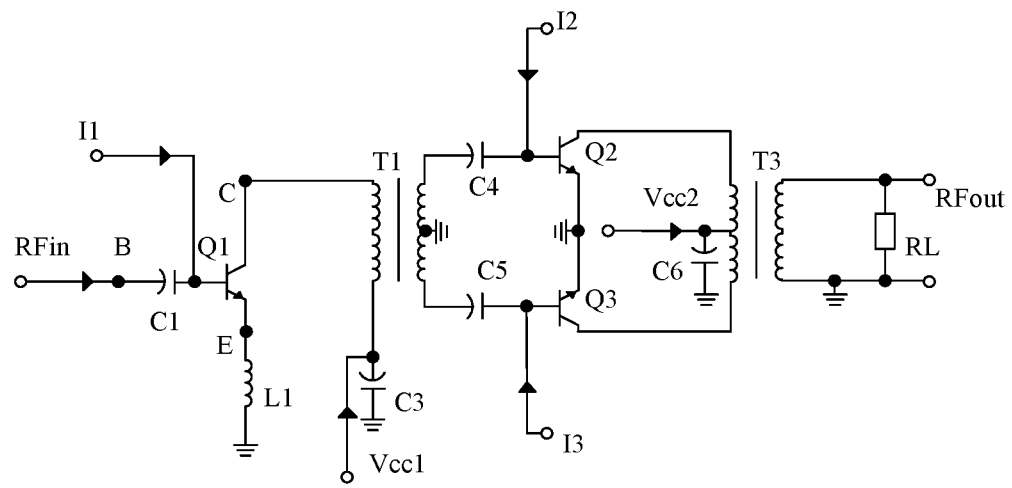
FIG. 1A is a schematic diagram of a circuit structure of a push-pull radio frequency power amplifier in some implementations.

FIG. 1A is a schematic diagram of the circuit structure of a push-pull radio frequency power amplifier in some implementations. As shown in FIG. 1A, the HBT process is taken as an example for illustration and since the gain of a single stage is about 10-18 dB, in order to provide sufficient gain, a cascade design of a drive stage circuit and a power output stage circuit is required. Here, the drive stage circuit includes: a first input matching capacitor C1, a first transistor Q1, a first transformer T1, a first bypass coupling capacitor C3 and a grounded inductance L1, in which, the points E, B and C correspond to the emitter, the base and the collector of the first transistor Q1 respectively and the L1 represents the equivalent inductance generated by grounding, not a inductor that actually exists in the drive stage circuit.

The power output stage circuit includes: a second input matching capacitor C4, a second transistor Q2, a third input matching capacitor C5, a third transistor Q3, a third transformer T3, a second bypass coupling capacitor C6 and a load RL. Herein, the first bypass coupling capacitor C3 and the second bypass coupling capacitor C6 can couple the alternating current (AC) component in direct current (DC) power supply to the ground to purify the DC power supply.

It can be seen from FIG. 1A that one end of the first input matching capacitor C1 is configured to receive the input signal RFin, and the other end is connected with the base of the first transistor Q1; the drive stage bias current I1 provides a bias current for the base of the first transistor Q1; the emitter of the first transistor Q1 is connected with a ground terminal; the collector of the first transistor Q1 is connected with one end of the primary coil of the first transformer T1, and the other end of the primary coil of the first transformer T1 is connected with a first DC power supply Vcc1 to supply power and grounded through the bypass coupling capacitor C3.

The secondary coil of the first transformer T1 is connected with the base input end of the second transistor Q2 and the base input end of the third transistor Q3 through the second input matching capacitor C4 and the third input matching capacitor C5, respectively, and an externally connectable tap may be led out in the middle or other positions of the coil. Here, the tap may be grounded, open, or connected with any load. FIG. 1A illustratively shows a case where the tap is grounded.

The first power stage bias current I2 provides bias current for the base of the second transistor Q2; the second power stage bias current I3 provides bias current for the base of the third transistor Q3; the emitters of the second transistor Q2 and the third transistor Q3 are grounded; the collectors of the second transistor Q2 and the third transistor Q3 are connected with the two endpoints of the primary coil of the third transformer T3, respectively; an tap is led out in the middle or other positions of the primary coil of the third transformer T3 to connect with a second DC power supply Vcc2 to supply power and the primary coil of the third transformer T3 is grounded through the bypass coupling capacitor C6; and one end of the secondary coil of the third transformer T3 is grounded, and the other end is connected with the load RL to output the signal RFout.

For the circuit structure described above, the third transformer T3 can realize the power combination of the second transistor Q2 and the third transistor Q3, and output the combination power to the load RL, and meanwhile the impedance is matched to the required impedance of the application end. Here, the impedance is generally 50 Ohm, but is not limited to 50 Ohm. The first transformer T1 provides the power distribution from the balanced end to the unbalanced end and the impedance conversion function, and the third transformer T3 provides the power synthesis from the unbalanced end to the balanced end and the impedance conversion function.

Figure 1B:
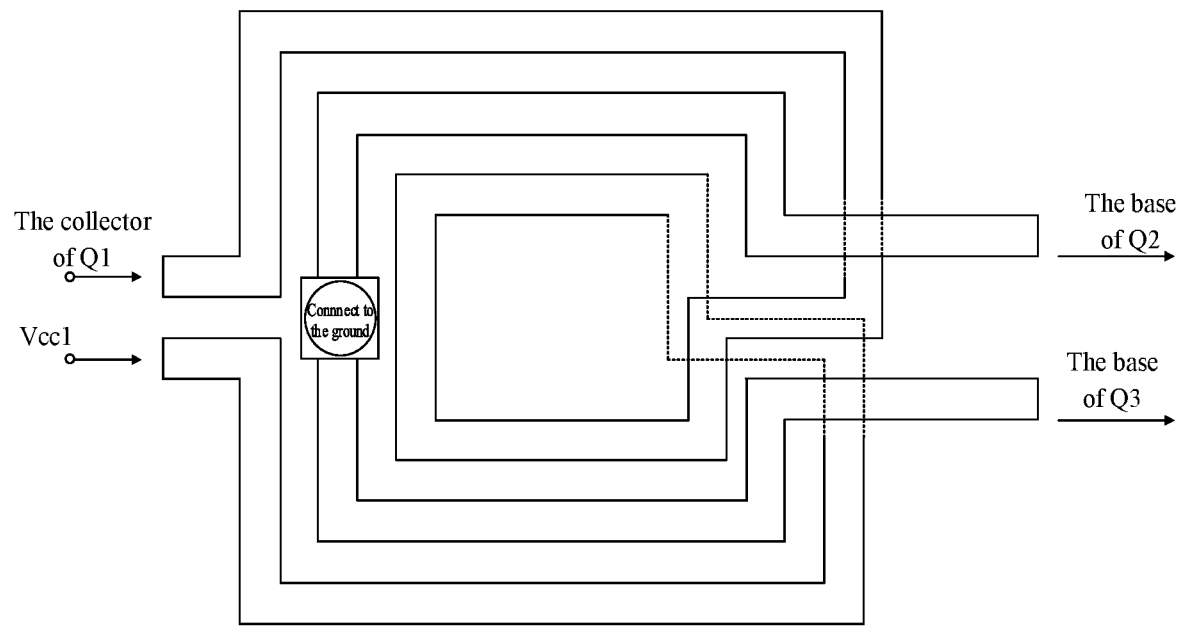
FIG. 1B is a schematic plan diagram of an implementation structure of a first transformer T1 in some implementations.
Figure 1C:
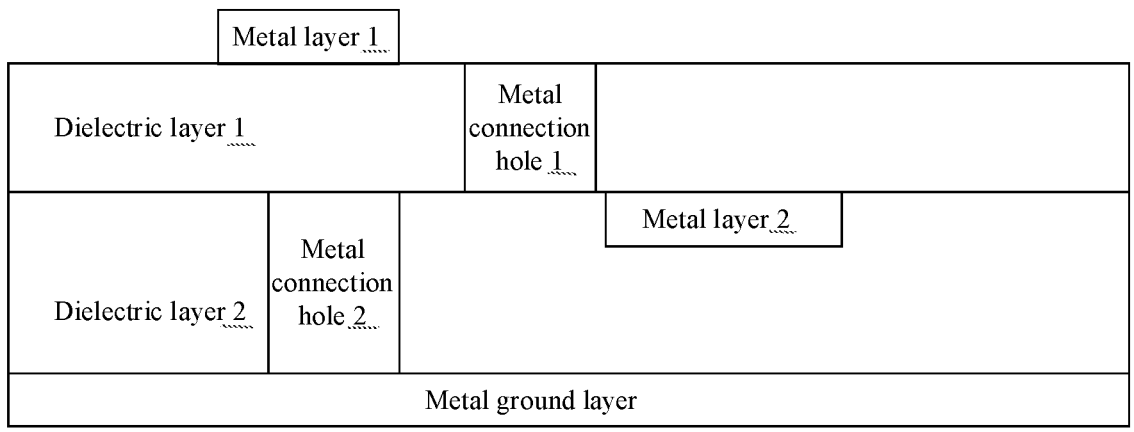
FIG. 1C is a schematic diagram of a structure of the substrate laminated layers of a first transformer T1 in some implementations.

FIG. 1B is a schematic plan diagram of the implementation structure of the first transformer T1 in some implementations. As shown in FIG. 1B, the first transformer T1 is consist of two winding inductors coupled with each other. The primary coil starts from the collector of the first transistor Q1 and is connected with the first DC power supply Vcc1. The secondary coil is connected with the base input ends of the second transistor Q2 and the third transistor Q3, and an externally connectable tap is led out in the middle or other positions of the secondary coil. FIG. 1C is a schematic diagram of the structure of the substrate laminated layers of the first transformer T1 in some implementations. As shown in FIG. 1C, the substrate laminated layers of the first transformer T1 includes: a metal layer 1, a metal layer 2, and a metal ground layer, in which the metal layer 1 is connected with the metal layer 2 through the metal connection hole 1 in the dielectric layer 1 and the metal layer 2 is connected with the metal ground layer through the metal connection hole 2 in the dielectric layer 2. In FIG. 1B, the metal wiring indicated by solid lines is located in the metal layer 1 of the substrate and the metal wiring indicated by dashed lines is located in the metal layer 2 of the substrate. The metal layers are connected with each other through the metal through holes.

In some implementations, since the two-stage push-pull radio frequency power amplifier is limited by the upper limit of the gain of a single-stage transistor, and additionally, the deterioration of the gain caused by the grounded inductor of the transistor and its own parasitic parameters will become more and more obvious in sub 6 GHz or even millimeter wave band, the problem of insufficient gain margin becomes more and more serious. FIG. 1D is a schematic diagram of the relationship between the gain and the output power of the radio frequency power amplifier in some implementations, in which the curve of this relationship is based on the relationship between the gain and the output power of the radio frequency power amplifier in the n79 (4400 MHz-5000 MHz) frequency band, which is designed as the circuit structure of FIG. 1A described above; in FIG. 1D, the horizontal axis indicates the output power with the unit of dBm, and the vertical axis indicates the gain of the radio frequency power amplifier with the unit of dB; the solid line shows the curve of the relationship between the gain and the output power when frequency is 4400 MHz and the dashed line shows the curve of the relationship between the gain and the output power when frequency is 4700 MHz; and the dot-and-dash line shows the curve of the relationship between the gain and the output power when the frequency is 5000 MHz.

Figure 1D:
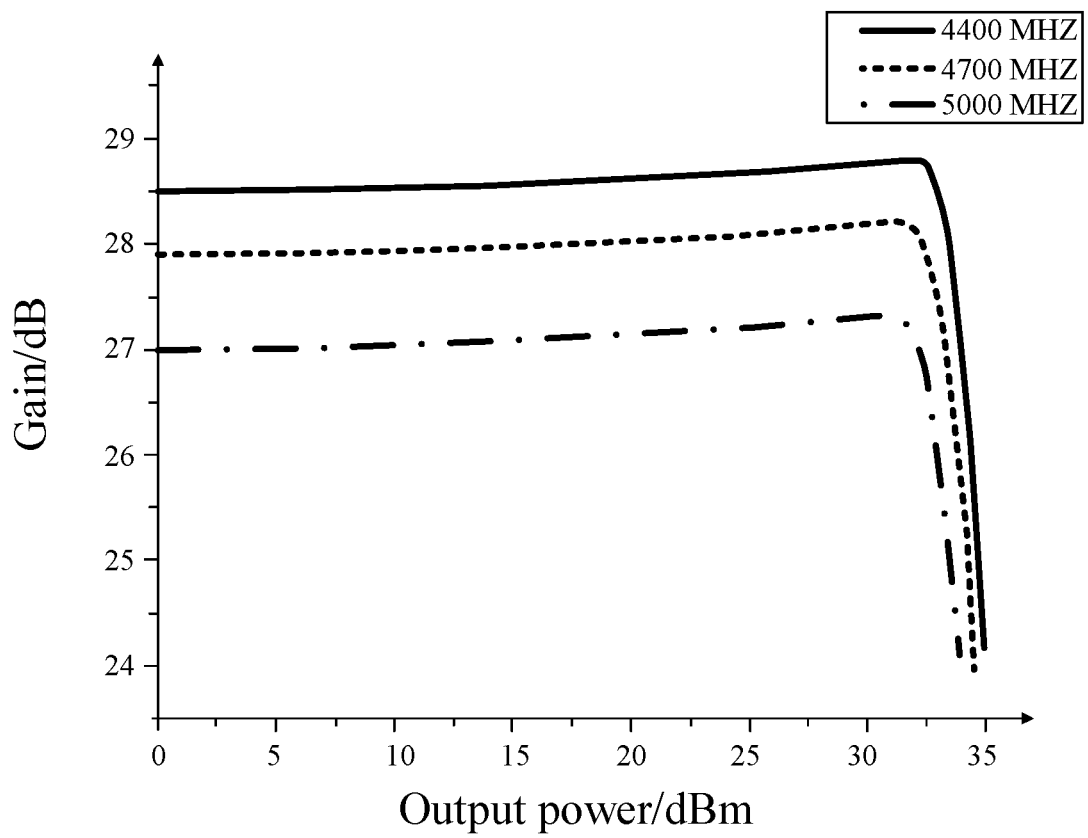
FIG. 1D is a schematic diagram of the relationship between the gain and the output power of a radio frequency power amplifier in some implementations.

It can be seen from FIG. 1D, with the increase of the frequency, the difficulty of increasing the gain of amplifier increases, obviously. In order to achieve 30 dB or even higher of the gain, a primary drive amplifier has to be added in front of the first transistor Q1 in this structure, but it will greatly increase the design complexity of the whole radio frequency power amplifier.

For the defects of the above technique, the disclosure provides a push-pull radio frequency power amplifier and a method for controlling circuit.

Based on the push-pull radio frequency power amplifier described above and the application scenarios, the following embodiments are proposed.

Figure 2A:
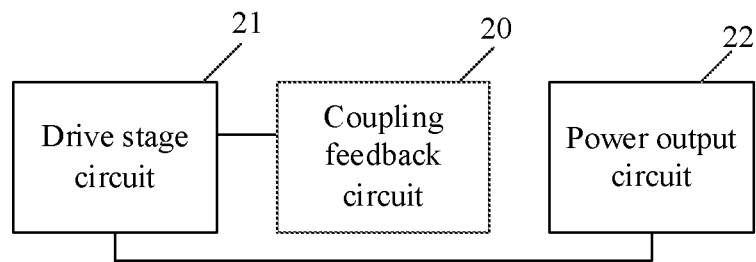
FIG. 2A is a first schematic diagram of a push-pull radio frequency power amplifier of an embodiment of the disclosure.

FIG. 2A is the first schematic diagram of a push-pull radio frequency power amplifier of an embodiment of the disclosure. As shown in FIG. 2A, the push-pull radio frequency power amplifier includes: a coupling feedback circuit 20, a drive stage circuit 21 and a power output stage circuit 22, in which the coupling feedback circuit 20 is connected with the drive stage circuit 21 and the drive stage circuit is connected with the power output stage circuit 22.

Figure 2B:
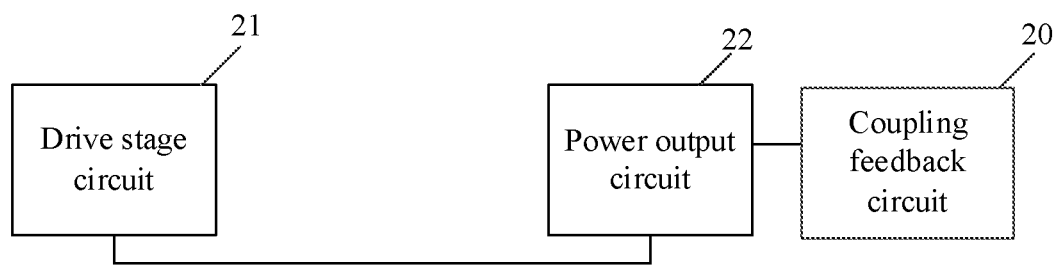
FIG. 2B is a second schematic diagram of a push-pull radio frequency power amplifier of an embodiment of the disclosure.

FIG. 2B is the second schematic diagram of a push-pull radio frequency power amplifier of an embodiment of the disclosure. As shown in FIG. 2B, the push-pull radio frequency power amplifier includes: a coupling feedback circuit 20, a drive stage circuit 21 and a power output stage circuit 22, in which the coupling feedback circuit 20 is connected with the power output stage circuit 22 and the drive stage circuit is connected with the power output stage circuit 22.

Figure 2C:
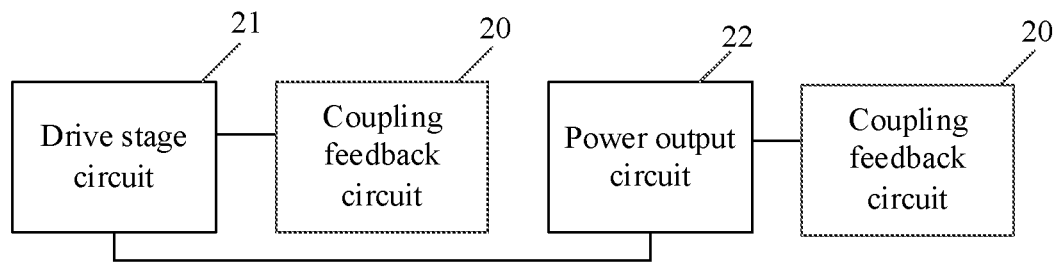
FIG. 2C is a third schematic diagram of a push-pull radio frequency power amplifier of an embodiment of the disclosure.

FIG. 2C is the third schematic diagram of a push-pull radio frequency power amplifier of an embodiment of the disclosure. The push-pull radio frequency power amplifier includes: a coupling feedback circuit 20, a drive stage circuit 21 and a power output stage circuit 22, in which the coupling feedback circuit 20 is connected with the drive stage circuit 21 and the power output stage circuit 22, respectively, and the drive stage circuit is connected with the power output stage circuit 22.

Herein, the coupling feedback circuit 20 is configured to generate an alternating voltage at the input end of the first transistor Q1 and/or the input end of a push-pull transistor. In the case where the alternating voltage and the voltage at the input end are in the same direction, positive feedback of an input signal at the input end is realized; and the first transistor Q1 represents the transistor in the drive stage circuit 21, and the push-pull transistor represents the second transistor Q2 and the third transistor Q3 that form a push-pull structure in the power output stage circuit 22.

In an embodiment, the first transistor Q1 and the push-pull transistor may be solid-state semiconductor devices which have a plurality of functions such as detection, amplification, signal modulation and so on. For example, the first transistor Q1 may include a HBT or a MOSFET; and the push-pull transistor may also include a HBT or a MOSFET.

In some embodiments, the coupling feedback circuit 20 is configured to generate an alternating voltage which represents a voltage in which the instantaneous value of the voltage varies with time and direction. Exemplarily, the alternating voltage may be a sinusoidal alternating voltage with different amplitudes and different directions. It may be determined according to the actual circuit structure, and is not limited in embodiments of the disclosure.

In an embodiment of the disclosure, the drive stage circuit 21 is connected with the power output stage circuit 22 to form a two-stage cascade structure. The driving stage circuit 21 may represent an intermediate circuit for amplifying an input signal, that is, the driving stage circuit 21 can drive the second transistor Q2 and the third transistor Q3 of the power output stage circuit 22 to operate by amplifying the signal.

In some embodiments of the disclosure, the second transistor Q2 and the third transistor Q3 forming the push-pull structure in the power output stage circuit 22 may represent two HBTs or MOSFETs. Here, the second transistor Q2 and the third transistor Q3 are responsible for the waveform amplification task of the positive and negative half cycles, respectively. When the power output stage circuit 22 is working, only one of the symmetrical second transistor Q2 and third transistor Q3 is turned on at a time, thereby reducing the turn-on loss.

In an embodiment of the disclosure, when the coupling feedback circuit 20 is connected with the drive stage circuit 21, if the alternating voltage generated by the coupling feedback circuit 20 and the voltage at the input end of the first transistor Q1 are in the same direction, resulting in the co-directional superposition of voltage at the input end of the first transistor Q1 and the alternating voltage, the positive feedback from the output end to the input end of the first transistor Q1 can be realized, and the signal strength of the input signal is improved.

In an embodiment of the disclosure, when the coupling feedback circuit 20 is connected with the power output stage circuit 22, if the alternating voltage generated by the coupling feedback circuit 20 and the voltage at the input end of the second transistor Q2 are in the same direction, resulting in the co-directional superposition of voltage at the input end of the second transistor Q2 and the alternating voltage, the positive feedback from the output end to the input end of the second transistor Q2 can be realized, and the signal strength of the input signal is improved; likewise, if the alternating voltage generated by the coupling feedback circuit 20 and the voltage at the input end of the third transistor Q3 are in the same direction, resulting in the co-directional superposition of voltage at the input end of the third transistor Q3 and the alternating voltage, the positive feedback from the output end to the input end of the third transistor Q3 can be realized, and the signal strength of the input signal is improved;

In view of the above, by realizing the positive feedback from the output end to the input end of the first transistor Q1 and/or the push-pull transistor (the second transistor Q2 and the third transistor Q3), the signal strength of the input signal can be effectively improved. In this way, without increasing the number of drive stages, the gain and output power of the push-pull radio frequency power amplifier can be effectively improved, and the design complexity of the radio frequency power amplifier can be reduced.

Figure 2D:
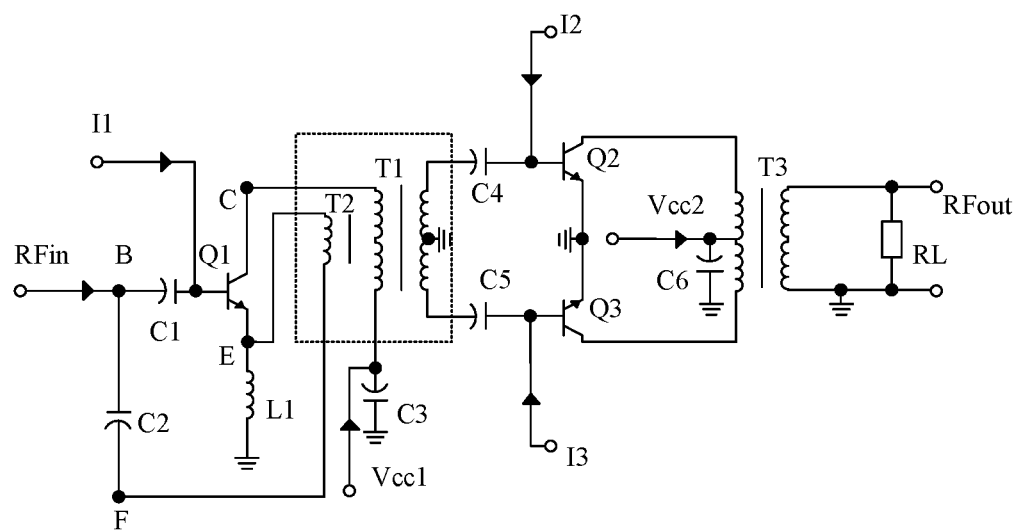
FIG. 2D is a first schematic diagram of a circuit structure of a push-pull radio frequency power amplifier of an embodiment of the disclosure.

FIG. 2D is the first schematic diagram of the circuit structure of a push-pull radio frequency power amplifier of an embodiment of the disclosure, which is illustrated by taking HBT process as an example. The push-pull radio frequency power amplifier in FIG. 2D is based on the push-pull radio frequency power amplifier in FIG. 2A, and FIG. 2D shows the specific connection relationship among the coupling feedback circuit 20, the drive stage circuit 21 and the power output stage circuit 22 in the case where the coupling feedback circuit 20 is connected to the drive stage circuit 21.

In an embodiment of the disclosure, the first transformer T1 is formed by coupling the primary coil led out from the collector of the first transistor Q1 with the secondary coil led out from the bases of the second transistor Q2 and the third transistor Q3; and the drive stage circuit stage circuit 21 is connected with the power output stage circuit 22 through the first transformer T1 which can transmit both signals and power.

It can be seen that different from the push-pull radio frequency power amplifier in FIG. 1A, the primary coil of the first transformer T1 is coupled with the secondary coil led out from the base of the first transistor Q1 to form a second transformer T2, and the coupling feedback circuit 20 includes the secondary coil led out from the base of the first transistor Q1. That is the coupling feedback circuit 20 is connected with the drive stage circuit 21.

In an embodiment of the disclosure, the positive pole of the secondary coil of the second transformer T2 is connected with the input end of the first transistor Q1, and the negative pole is connected with the ground terminal; one end of the primary coil of the second transformer T2 is connected to the first DC power supply Vcc1 for power supply.

Here, the drive stage bias current I1 provides a bias current for the base of the first transistor Q1; the first power stage bias current I2 provides a bias current for the base of the second transistor Q2; and the second power stage bias current I3 provides a bias current for the base of the third transistor Q3.

Figure 2E:
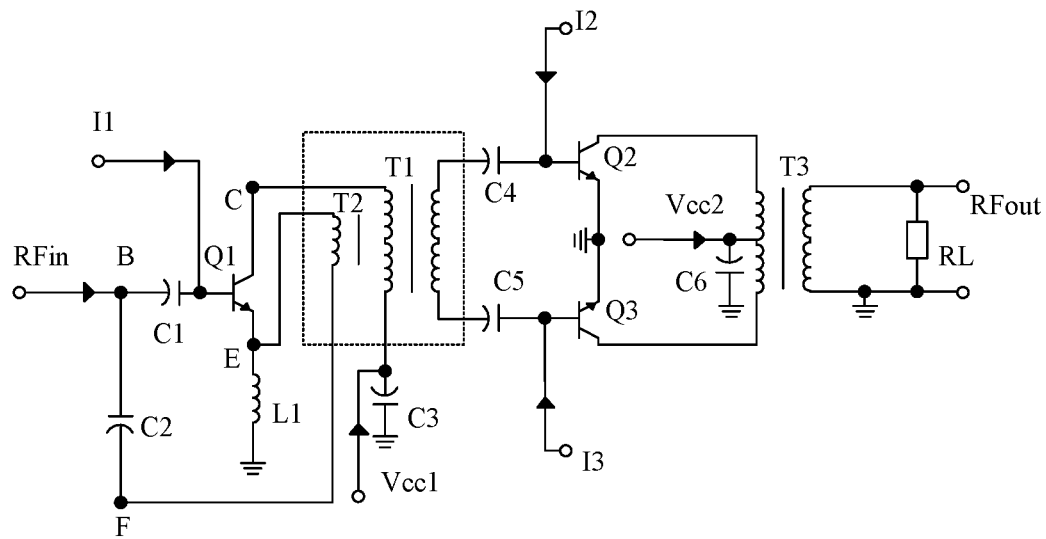
FIG. 2E is a second schematic diagram of a circuit structure of a push-pull radio frequency power amplifier of an embodiment of the disclosure.

FIG. 2E is the second schematic diagram of the circuit structure of a push-pull radio frequency power amplifier of an embodiment of the disclosure. As shown in FIG. 2E, on the basis of FIG. 2D, the difference is that the secondary coil of the first transformer T1 is not grounded.

Figure 2F:
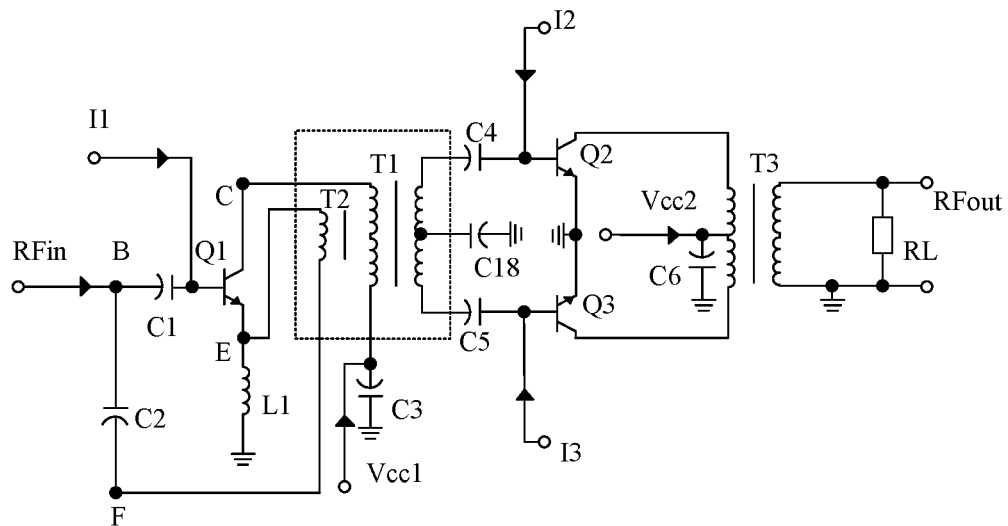
FIG. 2F is a third schematic diagram of a circuit structure of a push-pull radio frequency power amplifier of an embodiment of the disclosure.

FIG. 2F is the third schematic diagram of the circuit structure of a push-pull radio frequency power amplifier of an embodiment of the disclosure. As shown in FIG. 2F, based on FIG. 2D, in this circuit structure, the tap led out from the middle or other positions of the secondary coil of the first transformer T1 is grounded through the capacitor.

The first transformer T1, the second transformer T2, and the third transformer T3 in FIG. 2D, FIG. 2E, and FIG. 2F may be equivalent transformers of a balun converter, respectively. Here, a transformer is a device that changes AC and voltage utilizing the principle of electromagnetic induction and its main components are a primary coil, a secondary coil and an iron core (magnetic core). The main functions of a transformer include voltage conversion, current conversion, impedance conversion, isolation, voltage stabilization and so on. The primary coil represents the input end of a transformer, which is generally connected with a DC power supply. The primary coil absorbs energy from the DC power supply and transmits energy to the secondary coil by electromagnetic induction. The secondary coil represents the output end of the transformer. Upon receiving the electromagnetic induction from the primary coil, the secondary coil generates an alternating voltage.

With respect to the balun converter, according to the theory of coupling inductance and ideal transformer, FIG. 2G is the first schematic diagram of the relationship between induced voltage generated by the electromagnetic coupling of an ideal transformer and coil polarity in related technology and FIG. 2H is the second schematic diagram of the relationship between induced voltage generated by the electromagnetic coupling of an ideal transformer and coil polarity in related technology. As shown in FIG. 2G and FIG. 2H, T represents the balun converter, Ui is the input voltage, and Uo is the induced voltage. It can be realized that the induced voltage Uo has the same phase as the input voltage Ui or has the opposite phase to the same by adjusting the polarities of the primary coil and the secondary coil.

In an implementation, the coupling feedback circuit 20 further includes a feedback device. One end of the feedback device is configured to receive the alternating voltage, and the other end is connected with the input end of the first transistor and/or the input end of a push-pull transistor.

In an embodiment of the disclosure, one end of the feedback device is connected with the secondary coil of the coupling feedback circuit 20; the other end of the feedback device is connected with the input end of the first transistor Q1; and thus when the coupling feedback circuit generates the alternating voltage at the input end of the first transistor Q1, the alternating voltage can be received through the feedback device and transmitted to the input end of the first transistor Q1.

As shown in FIG. 2D, the feedback device is a coupling feedback capacitor C2. One end of the coupling feedback capacitor C2 is configured to receive the alternating voltage generated by the second transformer T2, and the other end of the coupling feedback capacitor C2 is connected with the input end of the first transistor Q1. Here, the position where the coupling feedback capacitor C2 is connected to the input end of the first transistor Q1 may be in front of or behind the first input matching capacitor C1.

Figure 2I:
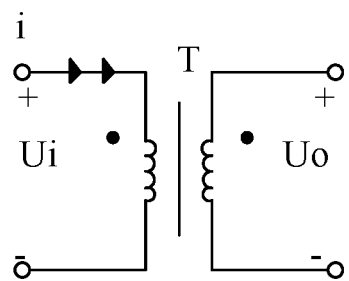
FIG. 2I is a first schematic plan diagram of an implementation structure of a first transformer T1 and a first transformer T2 in an embodiment of the disclosure.
Figure 2I:
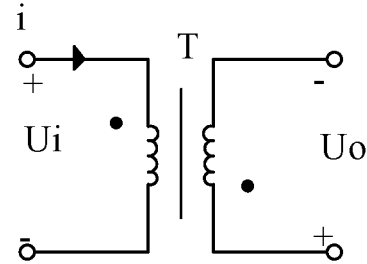
Figure 2I:
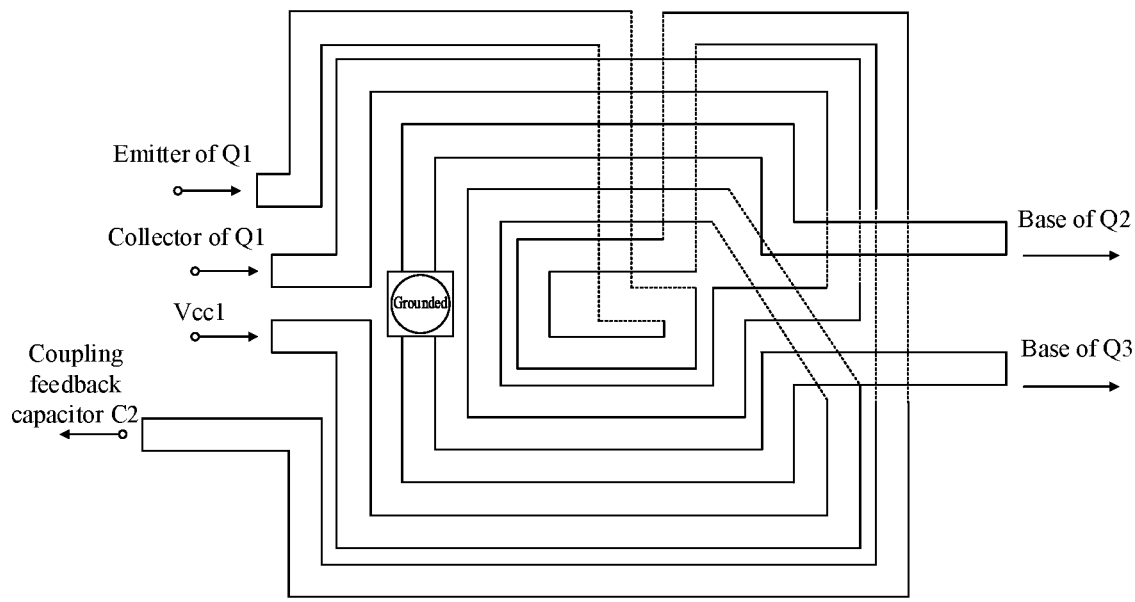

FIG. 2I is the first schematic plan diagram of the implementation structure of the first transformer T1 and the first transformer T2 in an embodiment of the disclosure. As shown in FIG. 2I, the first transformer T1 and the second transformer T2 are composed of two wound inductors coupled to each other. The primary coil of the first transformer T1 starts from the collector of the first transistor Q1 and is connected to the first DC power supply Vcc1; and the secondary coil of the first transformer T1 is connected to the base input ends of the second transistor Q2 and the third transistor Q3, and an externally connected tap is led out in the middle or other positions of the coil, which is grounded as an example here. One end of the second Transformer T2 is connected with the coupling feedback capacitor C2, and the other end is connected to the emitter of the first transistor Q1. The metal wiring indicated by solid lines is located in the metal layer 1 of the substrate and the metal wiring indicated by dashed lines is located in the metal layer 2 of the substrate. The metal layers are connected with each other through metal through holes.

Figure 2J:
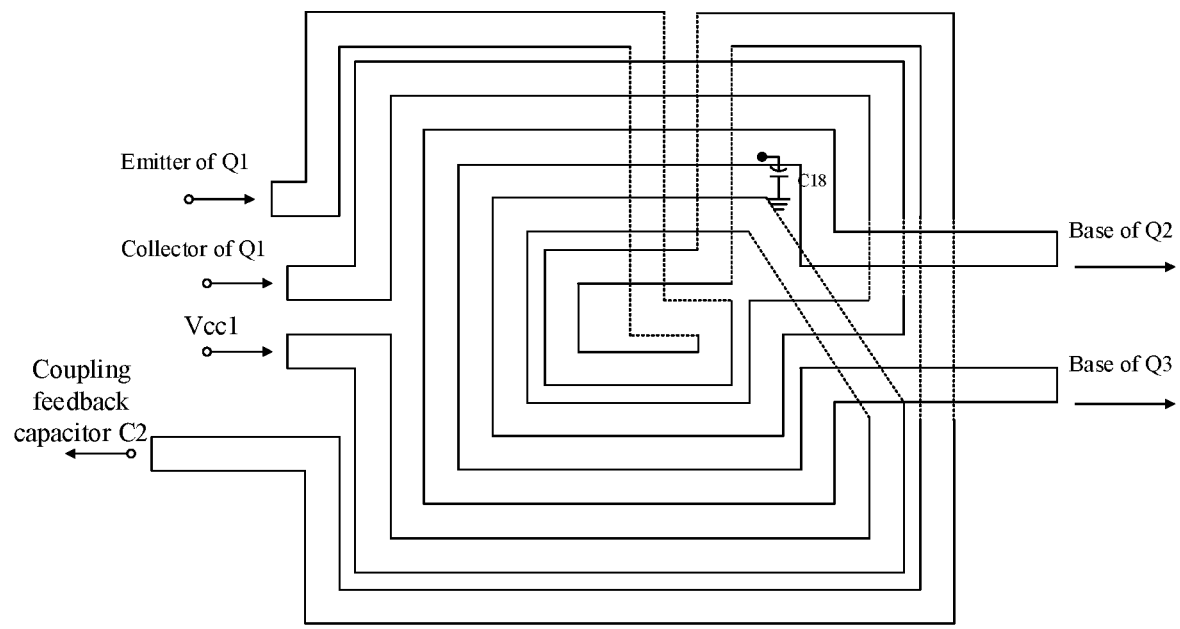
FIG. 2J is a second schematic plan diagram of an implementation structure of a first transformer T1 and a first transformer T2 in an embodiment of the disclosure.

FIG. 2J is the second schematic plan diagram of the implementation structure of the first transformer T1 and the first transformer T2 in an embodiment of the disclosure. As shown in FIG. 2J, the bases of the second transistor Q2 and the third transistor Q3 are connected to the ground by connecting a capacitor C18 through the secondary coil of the first transformer T1.

Figure 2K:
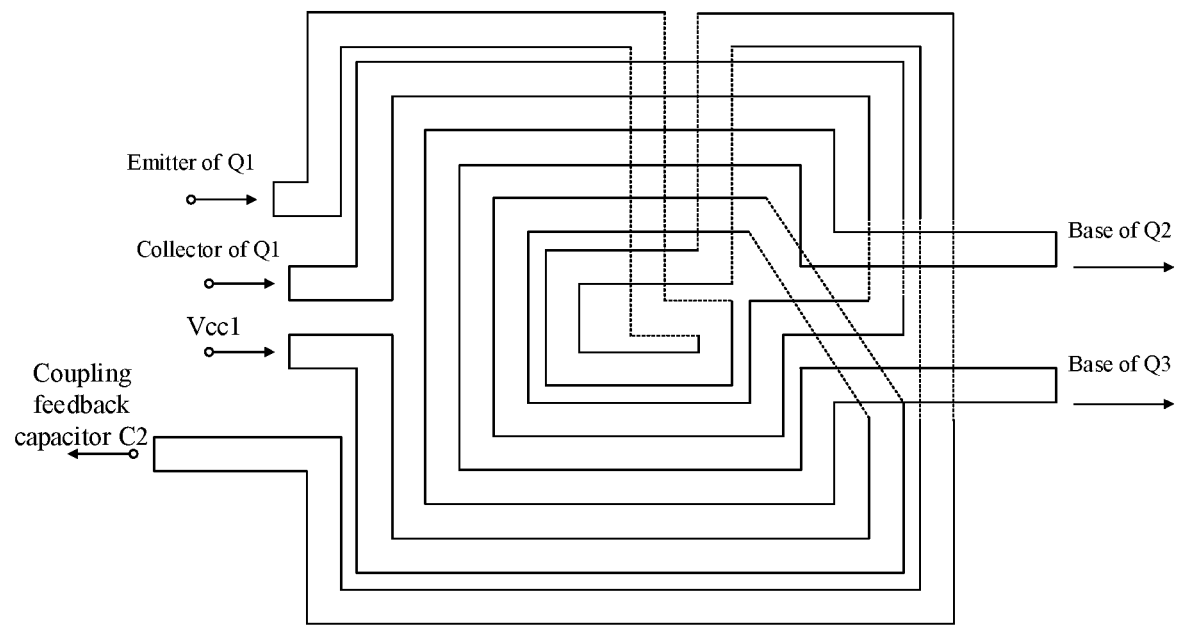
FIG. 2K is a third schematic plan diagram of an implementation structure of a first transformer T1 and a first transformer T2 in an embodiment of the disclosure.

FIG. 2K is the third schematic plan diagram of the implementation structure of the first transformer T1 and the first transformer T2 in an embodiment of the disclosure. As shown in FIG. 2K, the bases of the second transistor Q2 and the third transistor Q3 are no longer grounded through a tap led out from the secondary coil of the first transformer T1.

In an embodiment of the disclosure, for the first transistor Q1 connected with the common emitter, the alternating voltage at the base input point B of Q1 and the alternating voltage at the collector output point C have a phase difference close to 180 degrees. By introducing the coupling feedback circuit 20, i.e., the secondary coil led out from the base of the first transistor Q1, the second transformer T2 generates electromagnetic coupling and thus, a phase difference at point F and at point C is nearly 180 degrees. That is, the alternating voltage which is nearly in phase with the input signal at the input end of the first transistor Q1, and when this alternating voltage is connected to the input end through the coupling feedback capacitor C2, this is equivalent to adding positive feedback from the output to the input to the first transistor Q1, since the input signal strength can be effectively improved by the in-phase superposition of the signals. The embodiments of the disclosure can effectively improve the gain and output power of the whole power amplifier with the gains of the first transistor Q1, the second transistor Q2 and the third transistor Q3 being unchanged.

Figure 3A:
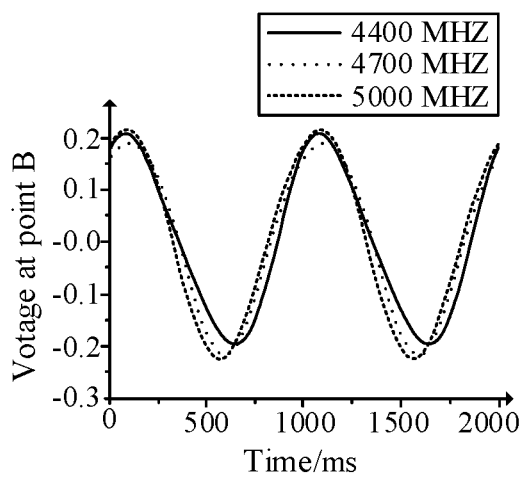
FIG. 3A is a schematic diagram of the alternating voltage at circuit point B in an embodiment of the disclosure.
Figure 3B:
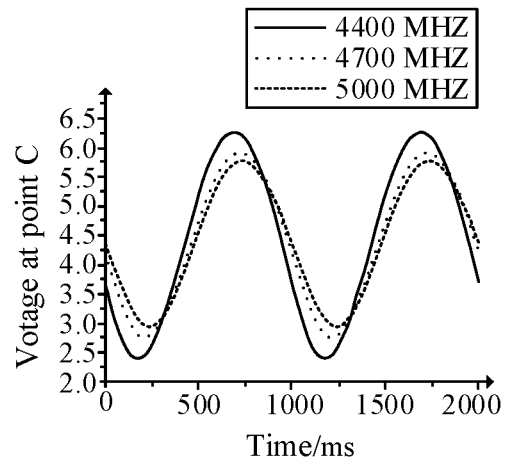
FIG. 3B is a schematic diagram of the alternating voltage at circuit point C in an embodiment of the disclosure.
Figure 3C:
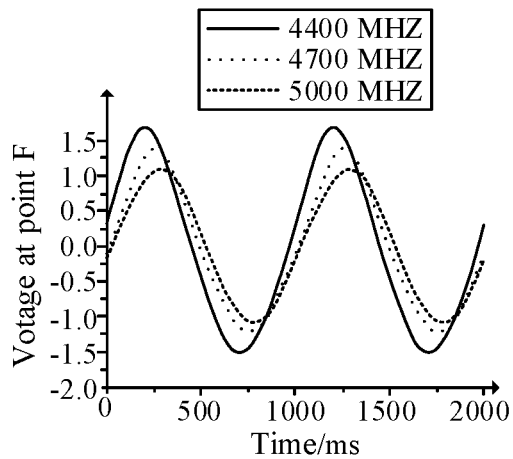
FIG. 3C is a schematic diagram of the alternating voltage at circuit point F in an embodiment of the disclosure.

FIG. 3A is a schematic diagram of alternating voltage at circuit point B in an embodiment of the disclosure; FIG. 3B is a schematic diagram of alternating voltage at circuit point C in an embodiment of the disclosure; and FIG. 3C is a schematic diagram of alternating voltage at circuit point F in an embodiment of the disclosure. Here, FIG. 3A, FIG. 3B and FIG. 3C are schematic diagrams of time-domain waveforms of the alternating voltage at the three points of circuit points B, C, and F.

The horizontal axis represents time with the unit of ms, and the vertical axis represents voltage with the unit of V; and the respective waveform schematic diagrams represent the waveform schematic diagrams of the alternating voltage at points B, C and F with frequencies of 4400 MHz, 4700 MHz and 5000 MHz.

It can be seen from the figures that although, the phase difference at point B and point C, as well as the phase difference at point C and point F are not ideal 180 degrees due to the affection of parasitic parameters of the first transistor Q1 changing with the frequency, the broadband positive feedback optimization can be realized for different frequency points by adjusting the first input matching capacitor C1, the coupling feedback capacitor C2 and the second transformer T2.

Figure 3D:
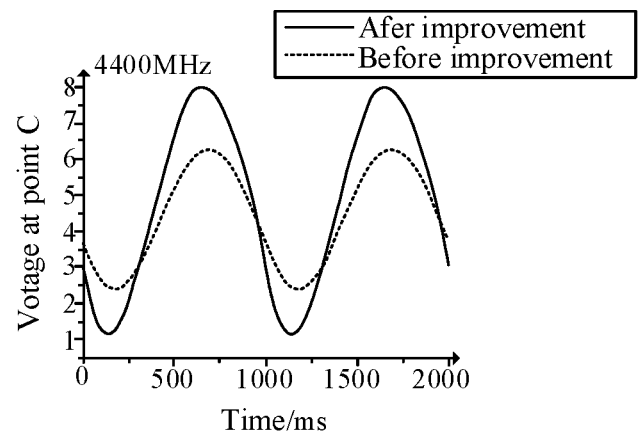
FIG. 3D is a first schematic diagram of the alternating voltage at circuit point C in an embodiment of the disclosure.
Figure 3E:
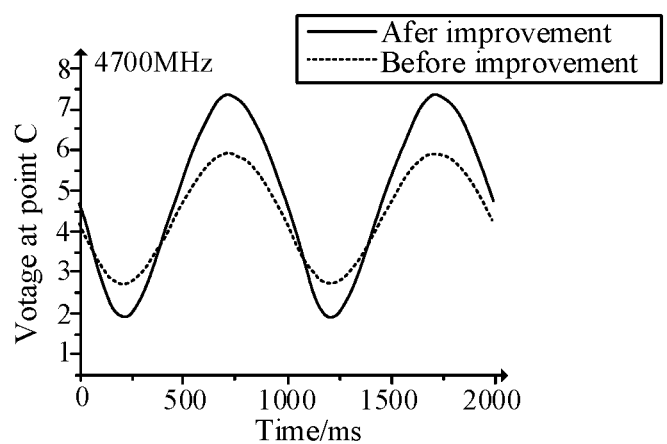
FIG. 3E is a second schematic diagram of the alternating voltage at circuit point C in an embodiment of the disclosure.
Figure 3F:
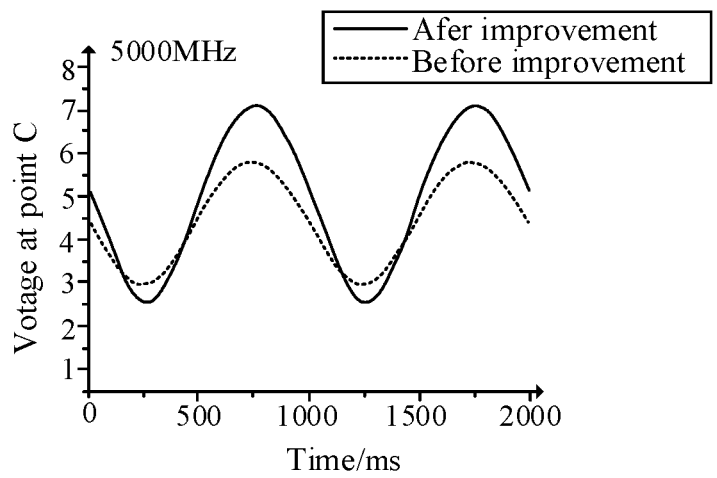
FIG. 3F is a third schematic diagram of alternating voltage at circuit point C in an embodiment of the disclosure.

Through the inter-stage coupling and positive feedback of the second transformer T2 in the embodiments of the disclosure, the gain and output power can be improved in a wider frequency band without increasing the number of drive stages. Here, taking n79 PA as an example, FIG. 3D is the first schematic diagram of alternating voltage at circuit point C in an embodiment of the disclosure; FIG. 3E is the second schematic diagram of alternating voltage at circuit point C in an embodiment of the disclosure; and FIG. 3F is the third schematic diagram of alternating voltage at circuit point C in an embodiment of the disclosure, in which the horizontal axis represents time with the unit of ms, and the vertical axis represents voltage with the unit of V. FIGS. 3D, 3e and 3f show the waveform schematic diagrams of the alternating voltage at points C at frequencies of 4400 MHz, 4700 MHz and 5000 MHz, respectively.

Here, the dashed lines represent the time-domain waveform diagrams before the improvement, and the solid lines represent the time-domain waveform diagrams after the improvement. It can be seen that the output gain of the drive stage circuit has been significantly improved after adopting the improved circuit of the disclosure.

Figure 4A:
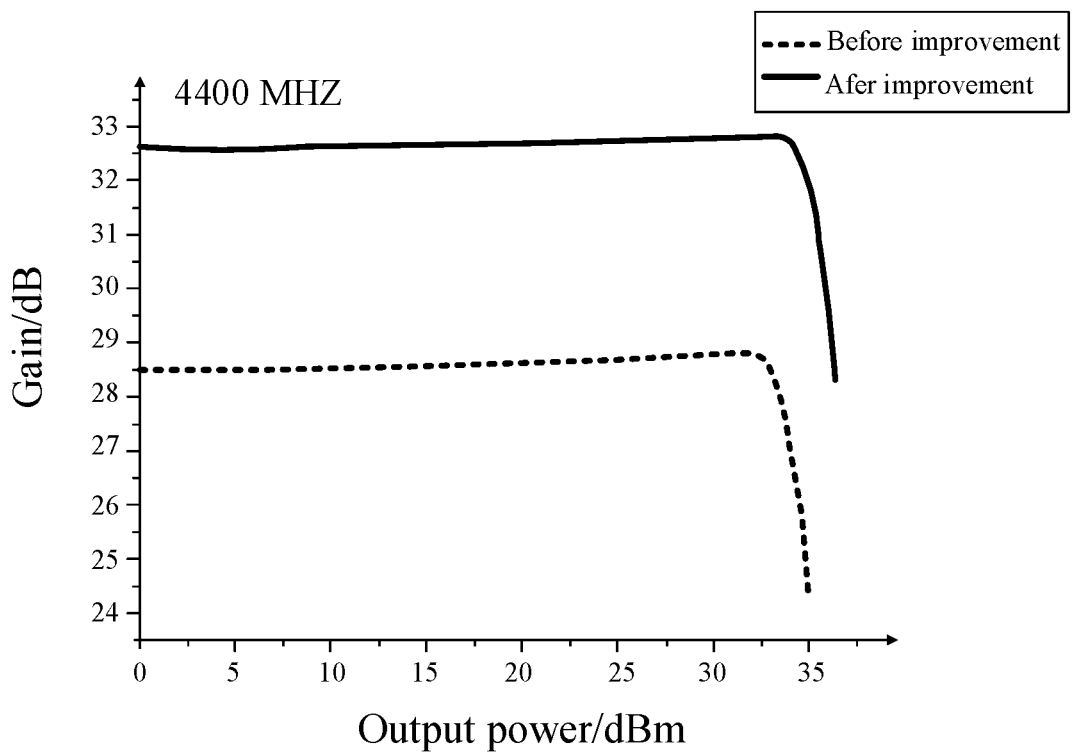
FIG. 4A is a first schematic diagram of the improvement of gain in an embodiment of the disclosure.
Figure 4B:
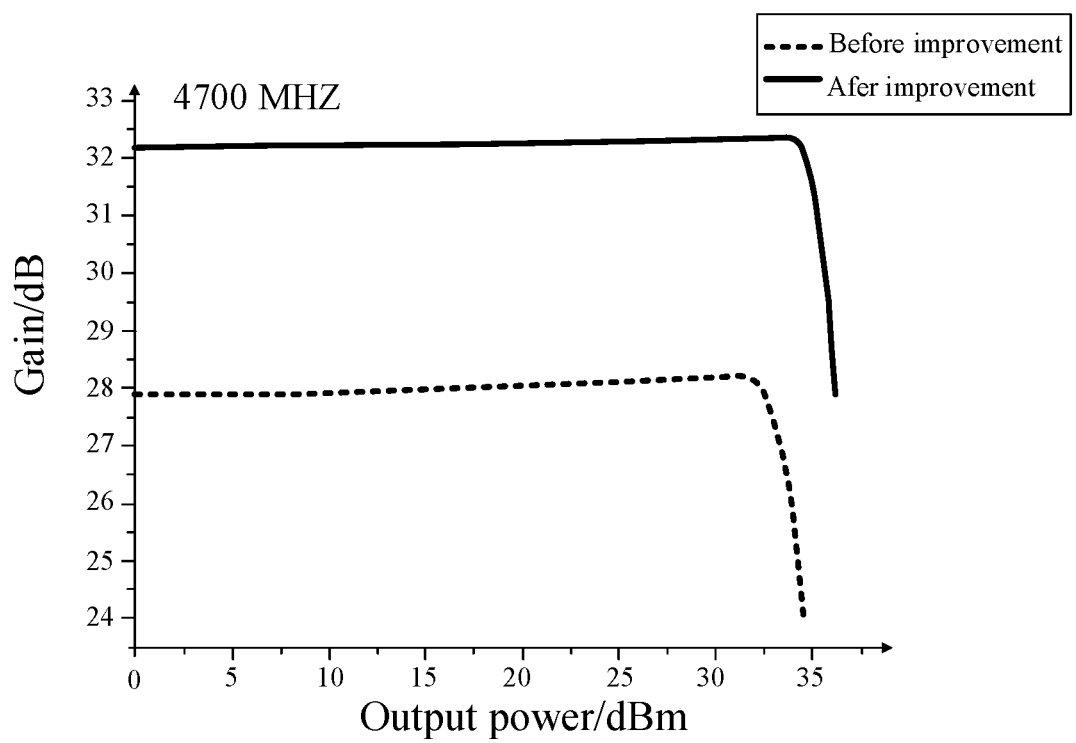
FIG. 4B is a second schematic diagram of the improvement of gain in an embodiment of the disclosure.
Figure 4C:
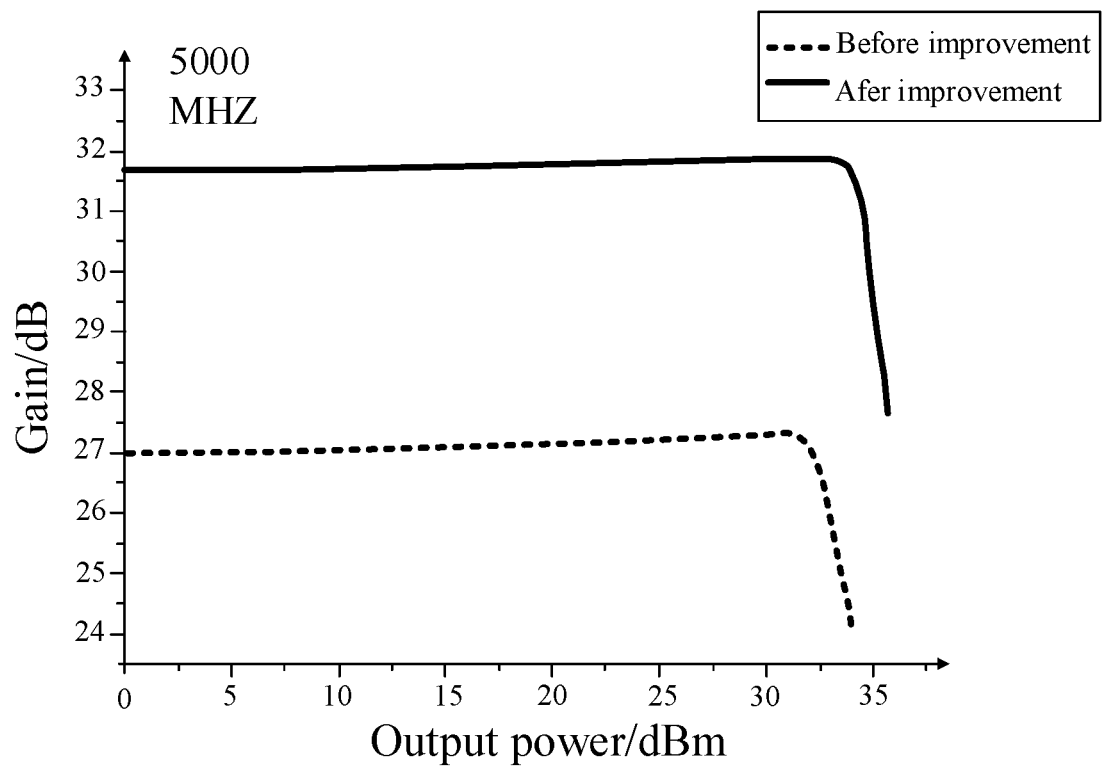
FIG. 4C is a third schematic diagram of the improvement of gain in an embodiment of the disclosure.

Further, FIG. 4A is the first schematic diagram of gain improvement in an embodiment of the disclosure; FIG. 4B is the second schematic diagram of gain improvement in an embodiment of the disclosure; and FIG. 4C is the third schematic diagram of gain improvement in an embodiment of the disclosure, in which the horizontal axis represents the output power with the unit of dBm, and the vertical axis represents the gain of the radio frequency power amplifier with the unit of dB. FIG. 4A, FIG. 4B and FIG. 4C show schematic diagrams of the gain improvements at frequencies of 4400 MHz, 4700 MHz and 5000 MHz, respectively.

Here, the dashed lines represent the gain waveform diagrams before the improvement, and the solid lines represent the gain waveform diagrams after the improvement. It can be seen that after adopting the improved circuit of the disclosure, the overall gain in N79 frequency band is significantly improved, and therefore the disclosure provides a good technical support for the design of 5G NR radio frequency power amplifiers.

On the other hand, since the second transformer T2 and the transmission line coupling structure have good broadband characteristics, the embodiments of the disclosure can be well suited to designs of the radio frequency power amplifiers in sub 6 GHz to FR2 millimeter wave band.

In addition, the disclosure is also applicable to different processes, including complementary metal oxide semiconductor (CMOS), gallium arsenide (GaAs), high electron mobility transistor (pHEMT), silicon-on-insulator (SOI), with which the disclosure can be conveniently used to realize the designs of the radio frequency power amplifiers with the high gain and high power. That is, the first transistor Q1, the second transistor Q2 and the third transistor Q3 in FIG. 2D can also be MOSFETs.

Figure 4D:
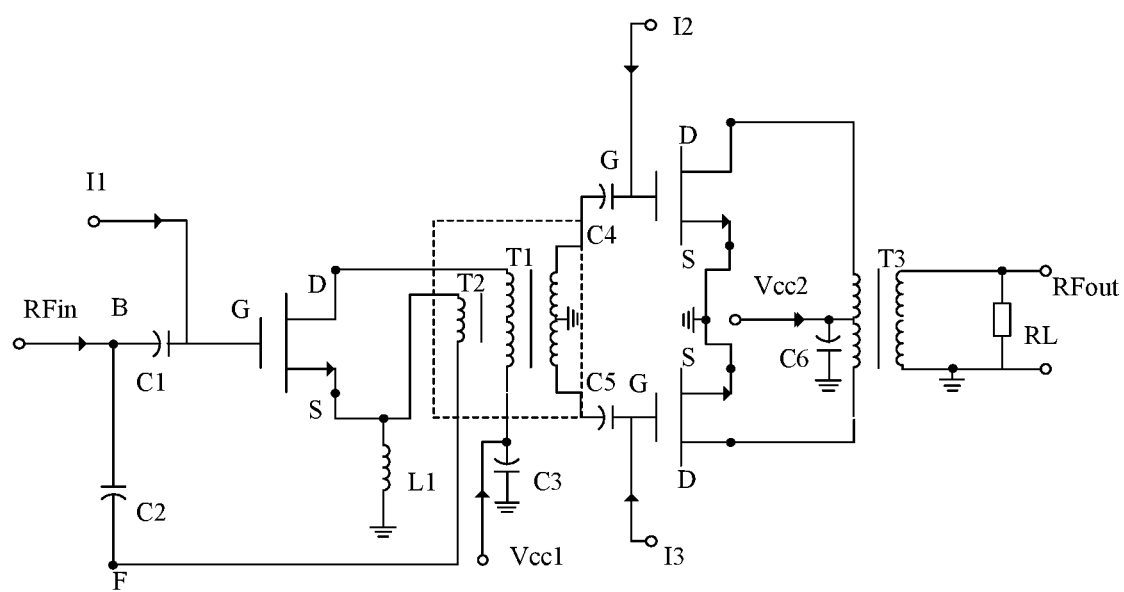
FIG. 4D is a second schematic diagram of the circuit structure of a push-pull radio frequency power amplifier in an embodiment of the disclosure.

FIG. 4D is the second schematic diagram of the circuit structure of a push-pull radio frequency power amplifier in an embodiment of the disclosure, which is illustrated by taking the MOSFE process as an example. The push-pull type radio frequency power amplifier in FIG. 4D is based on the push-pull type radio frequency power amplifier in FIG. 2D, and FIG. 4D shows the specific connection relationship among the coupling feedback circuit 20, the drive stage circuit 21, and the power output stage circuit 22 where the coupling feedback circuit 20 is connected with the drive stage circuit 21 and the power output stage circuit 22.

As shown in FIG. 4D, the gate G, the source S and the drain D of the MOSFET in FIG. 4D correspond to the base B, the emitter E and the collector C of the first transistor Q1, the second transistor Q2 and the third transistor Q3 in FIG. 2D, respectively; and other circuit structures are same as those in FIG. 2D.

In some embodiments, when the first transistor is the MOSFET, the primary coil of the first transformer is coupled with the secondary coil led out from the gate of the first transistor to form a second transformer; and the coupling feedback circuit includes the secondary coil led out from the gate of the first transistor.

In some embodiments, the secondary coil of the second transformer is connected with the ground terminal directly; or when the first transistor is the MOSFET, the secondary coil of the second transformer is connected with the ground terminal through the source of the first transistor.

In some embodiments, the power output stage circuit includes the third transformer. When the second transistor and the third transistor are the MOSFET, the primary coil of the third transformer is coupled with the secondary coil led out from the gate of the second transistor to form a fourth transformer; the primary coil of the third transformer is coupled with the secondary coil led out from the gate of the third transistor to form a fifth transformer; and the coupling feedback circuit includes the secondary coil led out from the gate of the second transistor and the secondary coil led out from the gate of the third transistor.

In some embodiments, the secondary coil of the fourth transformer is connected with the ground terminal directly; or when the second transistor is the MOSFET, the secondary coil of the fourth transformer is connected with the ground terminal through the source of the second transistor;

the secondary coil of the fifth transformer is connected with the ground directly;

or, when the third transistor is the MOSFET, the secondary coil of the fourth transformer is connected with the ground terminal through the source of the third transistor.

Figure 5A:
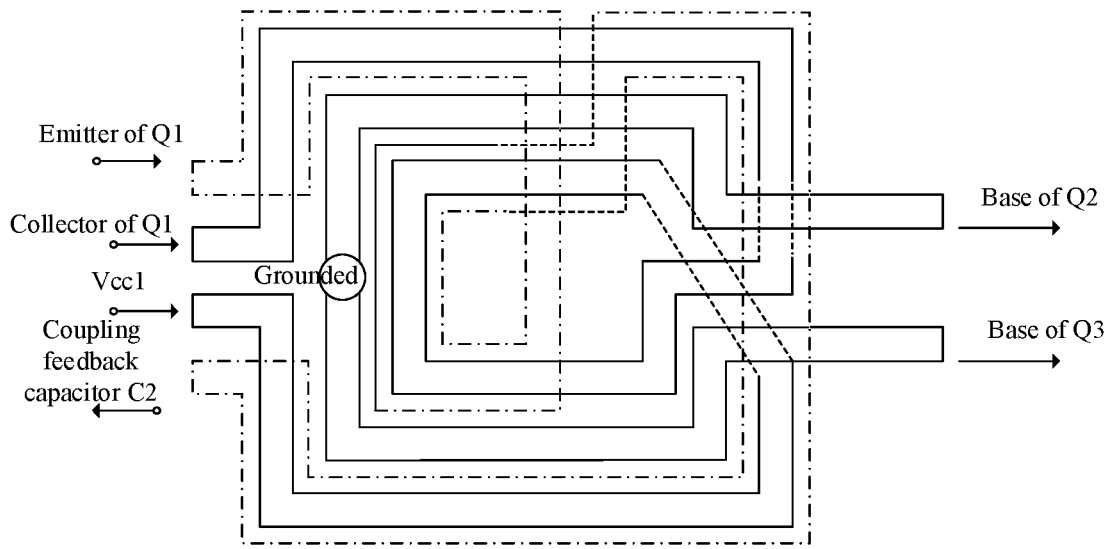
FIG. 5A is a schematic plan diagram of the structure of laminated layers of different transformers in an embodiment of the disclosure.
Figure 5B:
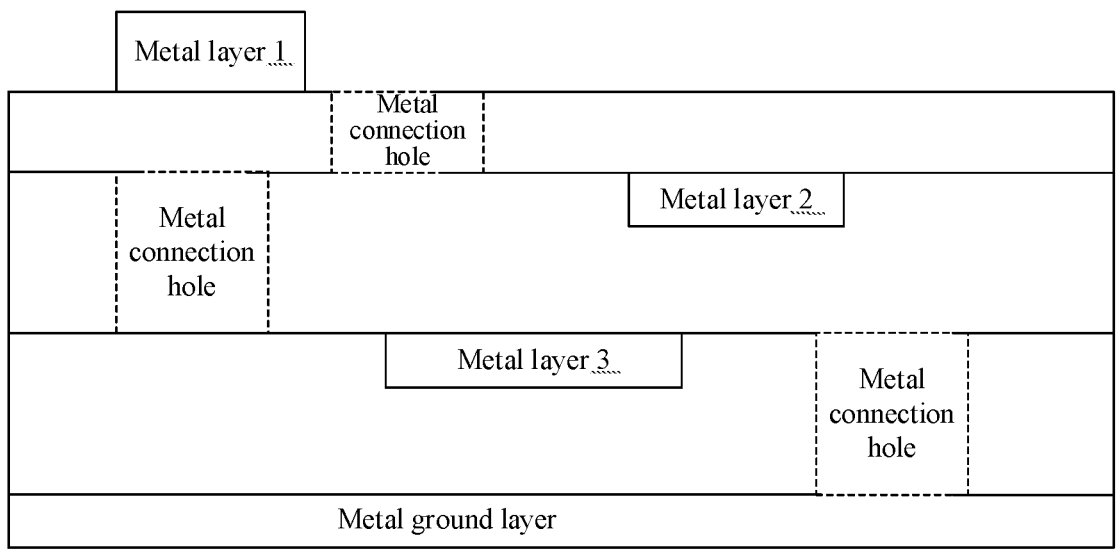
FIG. 5B is a schematic diagram of the structure of laminated layers in which metal wiring is located on the third layer of the substrate in an embodiment of the disclosure.
Figure 5C:
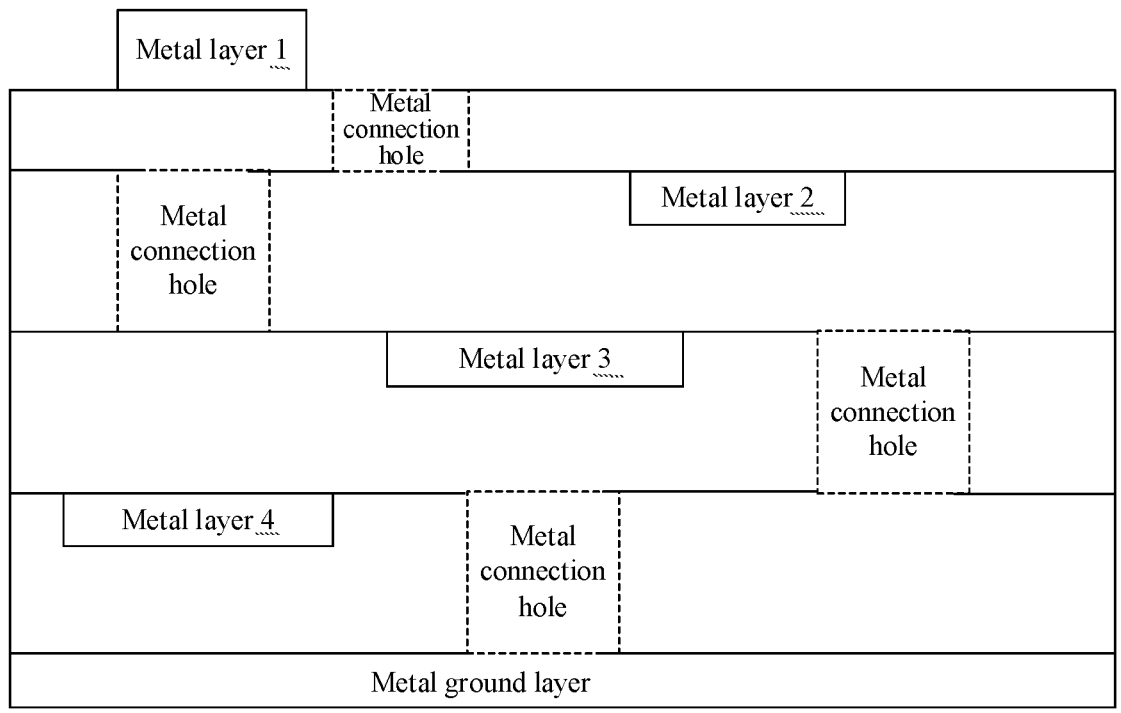
FIG. 5C is a schematic diagram of the structure of laminated layers in which metal wiring is located on the fourth layer of the substrate in an embodiment of the disclosure.

In some embodiments, when the coupling feedback circuit is connected with the drive stage circuit, the coupling feedback circuit and the drive stage circuit are located in different metal layers respectively to achieve interlayer coupling between surfaces of the different metal layers;

In an embodiment of the disclosure, the second transformer T2, i.e., the secondary coil of the coupling feedback circuit and the primary coil of the drive stage circuit that are located in different metal layers, achieves interlayer coupling between surfaces of the different metal layers. Here, the corresponding substrate laminated layers structure may include two layers of metal wiring, or three layers or more of metal wiring. FIG. 5A is a schematic plan diagram of the structure of laminated layers of different transformers in an embodiment of the disclosure, in which the metal wiring represented by the solid lines is located in the first layer of the metal layers of the substrate; the metal wiring represented by the dashed lines is located in the second layer of the metal layers of the substrate; the metal wiring represented by the dot-and-dash lines is located in the third or fourth layer of the metal layers of the substrate. FIG. 5B is a schematic diagram of the structure of laminated layers in which metal wiring is located on the third layer of the substrate in an embodiment of the disclosure, and FIG. 5C is a schematic diagram of the structure of laminated layers in which metal wiring is located on the fourth layer of the substrate in an embodiment of the disclosure, in which the metal layers are connected with each other through the metal connection holes.

In addition, the primary coil and secondary coil (coupling inductance) in each transformer in the disclosure can be connected together adopting multiple metal layers through through holes to form a thick metal layer, thus reducing metal loss.

Referring to FIG. 1A in combination with FIG. 2D, it can be seen that the circuit structure of the push-pull radio frequency power amplifier proposed in the embodiment of the disclosure introduces the coupling feedback circuit 20 based on the first transformer T1 in FIG. 1A, and the coupling feedback circuit 20 includes the secondary coil of the second transformer T2 and the feedback device; and the feedback device in FIG. 2D is a feedback coupling capacitor C2.

In an implementation, a feedback device is any one of the following: a coupling feedback capacitor, a variable capacitor, a varactor diode, a resistor-diode series branch, a RC series branch, a resistor and a filter. That is, a feedback device may be the feedback coupling capacitor C2 in FIG. 2D, or may also be any one of a variable capacitor, a varactor diode, a resistor diode series branch, a RC series branch, a resistor and a filter. In some embodiments the corresponding circuit structure diagrams of the feedback device are shown in FIG. 6A to FIG. 6J.

Figure 6A:
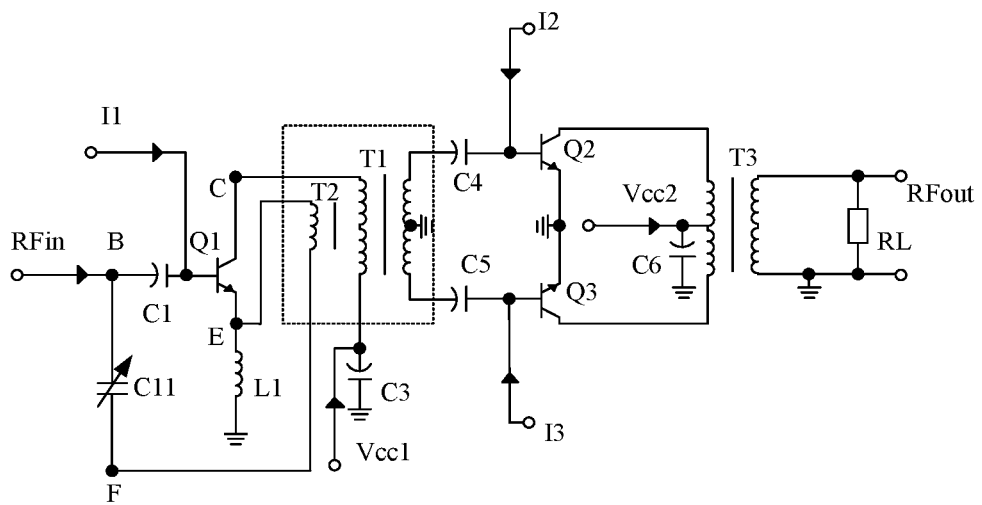
FIG. 6A is a schematic diagram of a circuit structure in which the feedback device is a variable capacitor in an embodiment of the disclosure.

FIG. 6A is a schematic diagram of a circuit structure in which the feedback device is a variable capacitor in an embodiment of the disclosure, and as shown in FIG. 6A, the feedback device is replaced from the feedback coupling capacitor C2 to a variable capacitor C11 in this circuit structure diagram based on FIG. 2D.

Figure 6B:
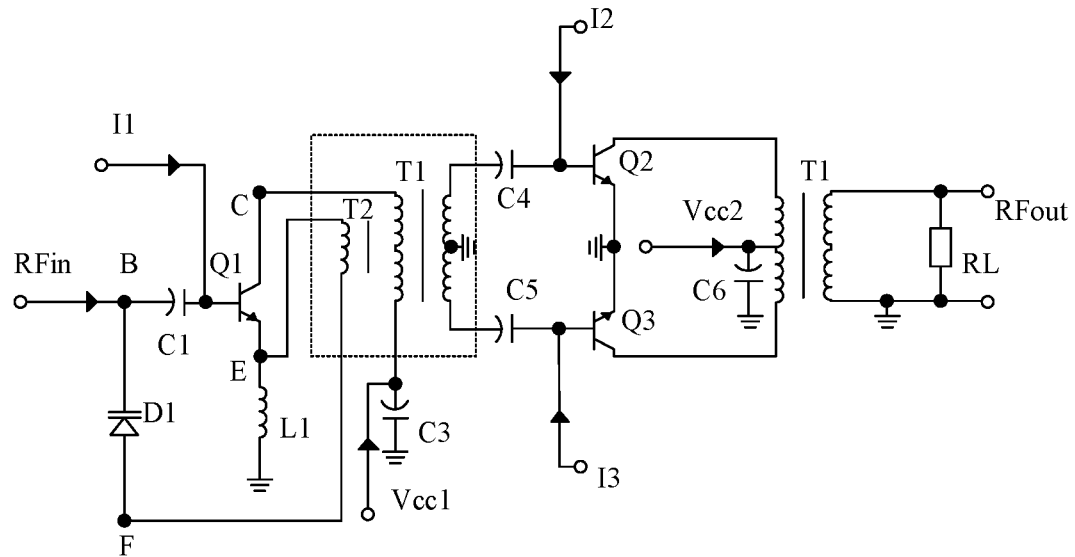
FIG. 6B is a schematic diagram of a circuit structure in which the feedback device is a varactor diode in an embodiment of the disclosure.

FIG. 6B is a schematic diagram of a circuit structure in which the feedback device is a varactor diode in an embodiment of the disclosure, and as shown in FIG. 6B, the feedback device is replaced from the feedback coupling capacitor C2 to a varactor diode D1 in this circuit structure diagram based on FIG. 2D.

Figure 6C:
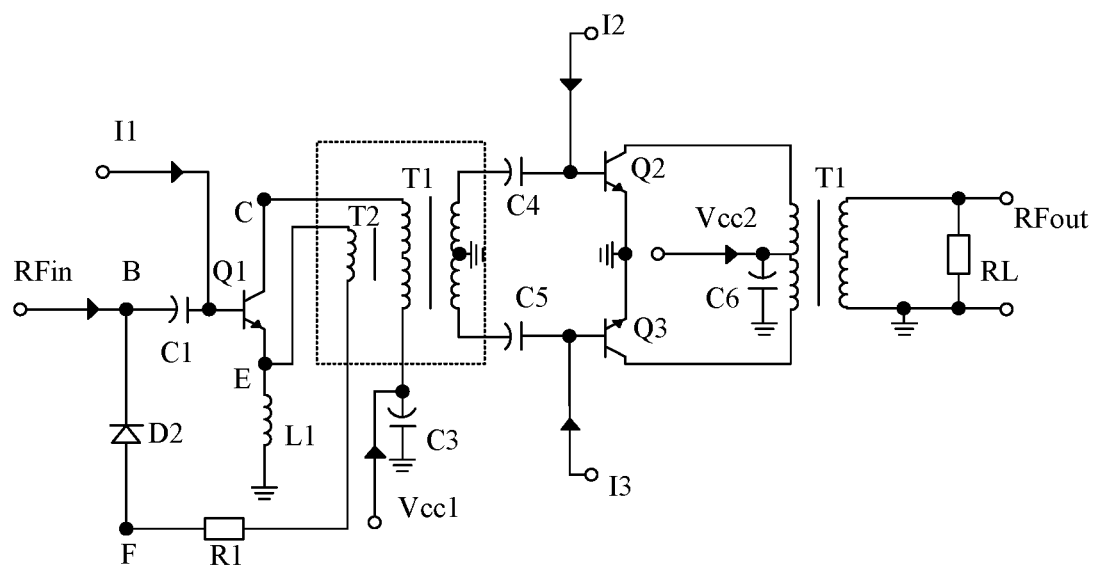
FIG. 6C is a schematic diagram of a circuit structure in which the feedback device is a resistor-diode series branch in an embodiment of the disclosure.

FIG. 6C is a schematic diagram of a circuit structure in which the feedback device is a resistor-diode series branch in an embodiment of the disclosure, and as shown in FIG. 6C, the feedback device is replaced from the feedback coupling capacitor C2 to resistor R1-diode D2 series branch in this circuit structure diagram based on FIG. 2D.

Figure 6D:
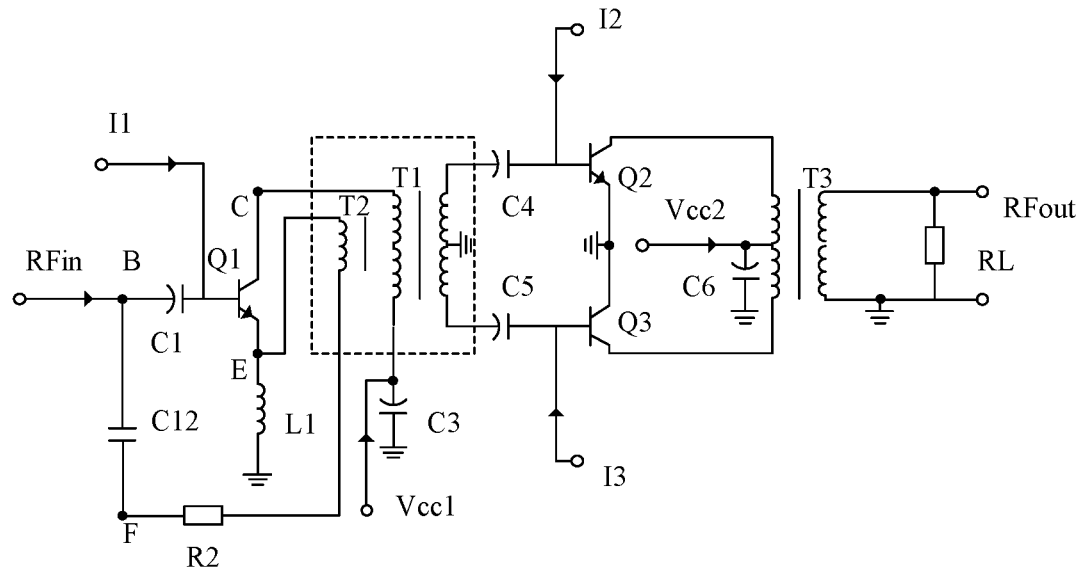
FIG. 6D is a schematic diagram of a circuit structure in which the feedback device is a RC series branch in an embodiment of the disclosure.

FIG. 6D is a schematic diagram of a circuit structure in which the feedback device is a RC series branch in an embodiment of the disclosure, and as shown in FIG. 6D, the feedback device is replaced from the feedback coupling capacitor C2 to R2 C12 series branch in this circuit structure diagram based on FIG. 2D.

Figure 6E:
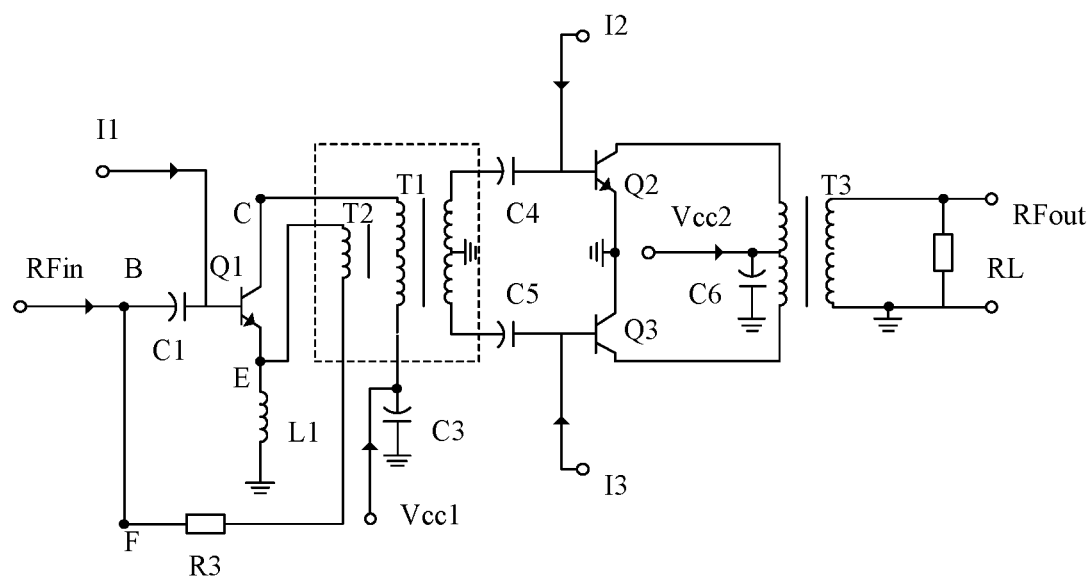
FIG. 6E is a schematic diagram of a circuit structure in which the feedback device is a resistor in an embodiment of the disclosure.

FIG. 6E is a schematic diagram of a circuit structure in which the feedback device is a resistor in an embodiment of the disclosure, and as shown in FIG. 6E, the feedback device is replaced from the feedback coupling capacitor C2 to a resistor R3 in this circuit structure diagram based on FIG. 2D.

Figure 6F:
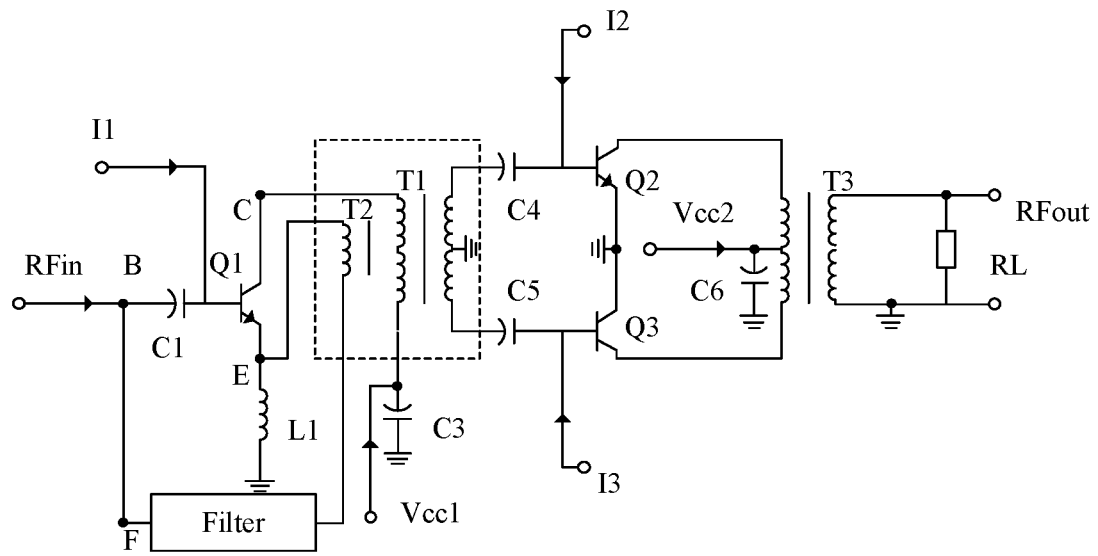
FIG. 6F is a schematic diagram of a circuit structure in which the feedback device is a filter in an embodiment of the disclosure.

FIG. 6F is a schematic diagram of a circuit structure in which the feedback device is a filter in an embodiment of the disclosure, and as shown in FIG. 6F, the feedback device is replaced from the feedback coupling capacitor C2 to a filter in this circuit structure diagram based on FIG. 2D.

Herein, the filter shown in FIG. 6 may be an L-type high-pass filter, a L-type low-pass filter, a pi type filter and other type filters.

Figure 6G:
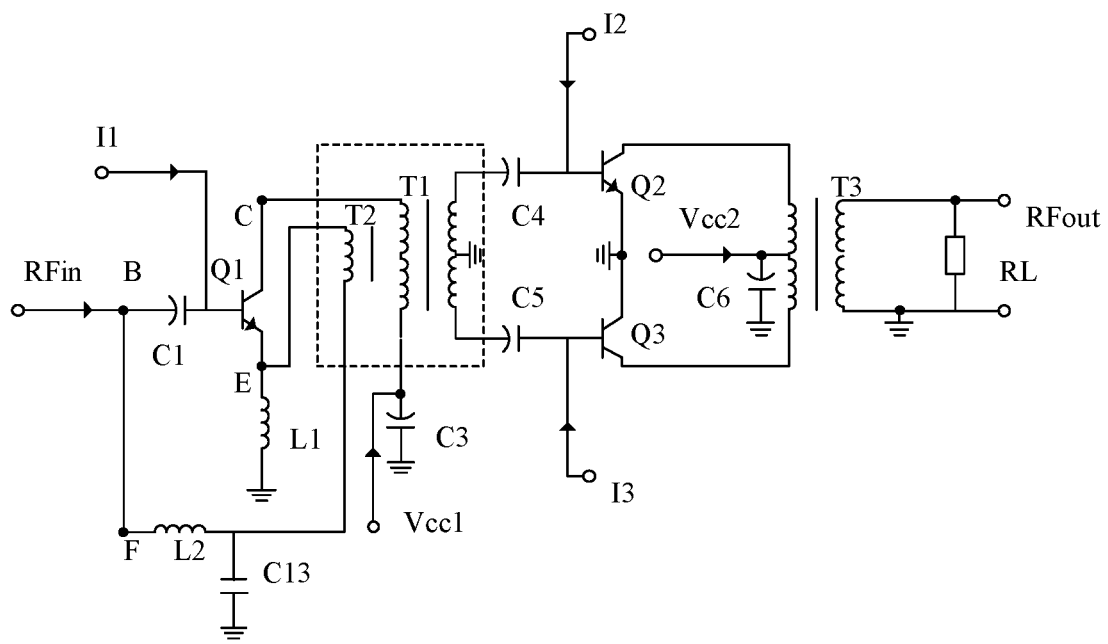
FIG. 6G is a first schematic diagram of a circuit structure in which the feedback device is an L-type low-pass filter in an embodiment of the disclosure.

FIG. 6G is the first schematic diagram of a circuit structure in which the feedback device is an L-type low-pass filter in an embodiment of the disclosure, and as shown in FIG. 6G, the feedback device is replaced from the feedback coupling capacitor C2 to an L-type low-pass filter L2 C13 in this circuit structure diagram based on FIG. 2D.

Figure 6H:
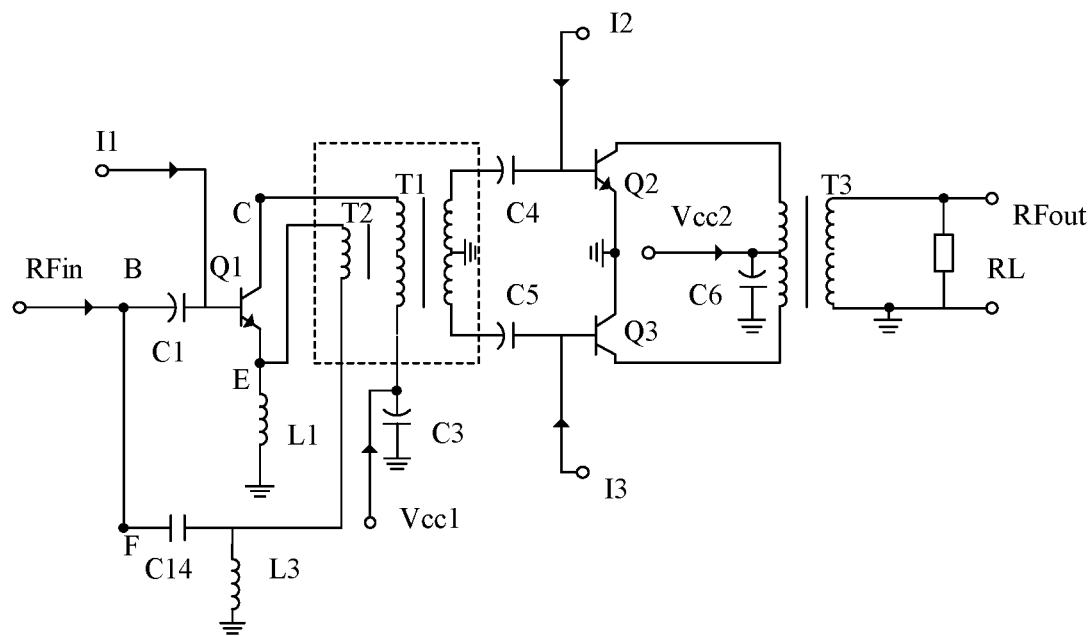
FIG. 6H is a second schematic diagram of a circuit structure in which the feedback device is an L-type high-pass filter in an embodiment of the disclosure.

FIG. 6H is the second schematic diagram of a circuit structure in which the feedback device is an L-type high-pass filter in an embodiment of the disclosure, and as shown in FIG. 6H, the feedback device is replaced from the feedback coupling capacitor C2 to an L-type high-pass filter L3 C14 in this circuit structure diagram based on FIG. 2D.

Figure 6I:
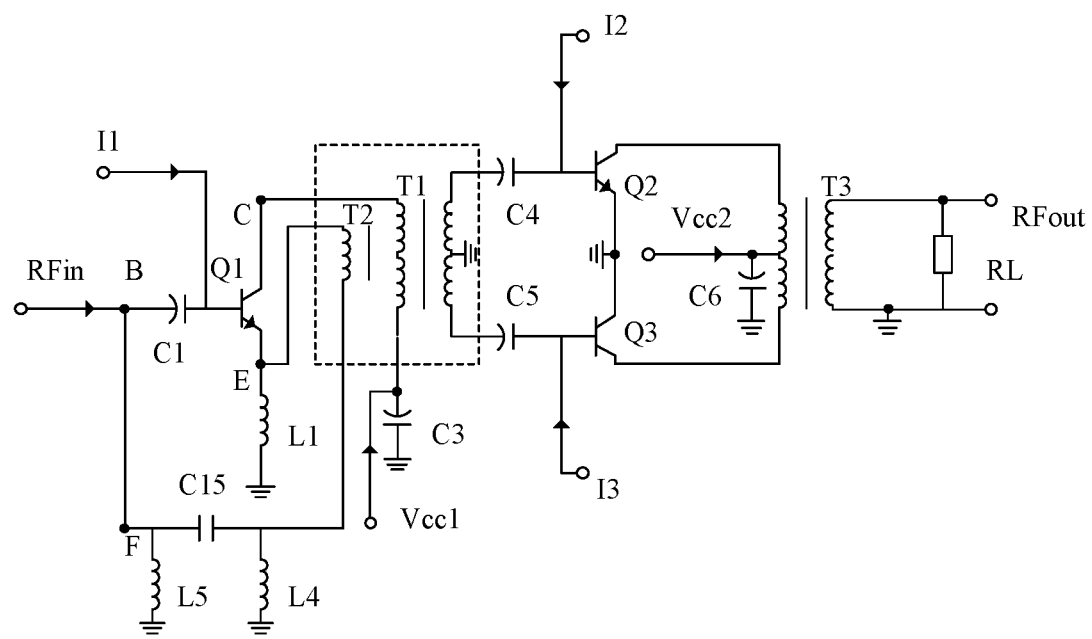
FIG. 6I is a first schematic diagram of a circuit structure in which the feedback device is a pi type filter in an embodiment of the disclosure.

FIG. 6I is the first schematic diagram of a circuit structure in which the feedback device is a pi type filter in an embodiment of the disclosure, and as shown in FIG. 6I, the feedback device is replaced from the feedback coupling capacitor C2 to a pi type filter L4 C15 L5 in this circuit structure diagram based on FIG. 2D.

Figure 6J:
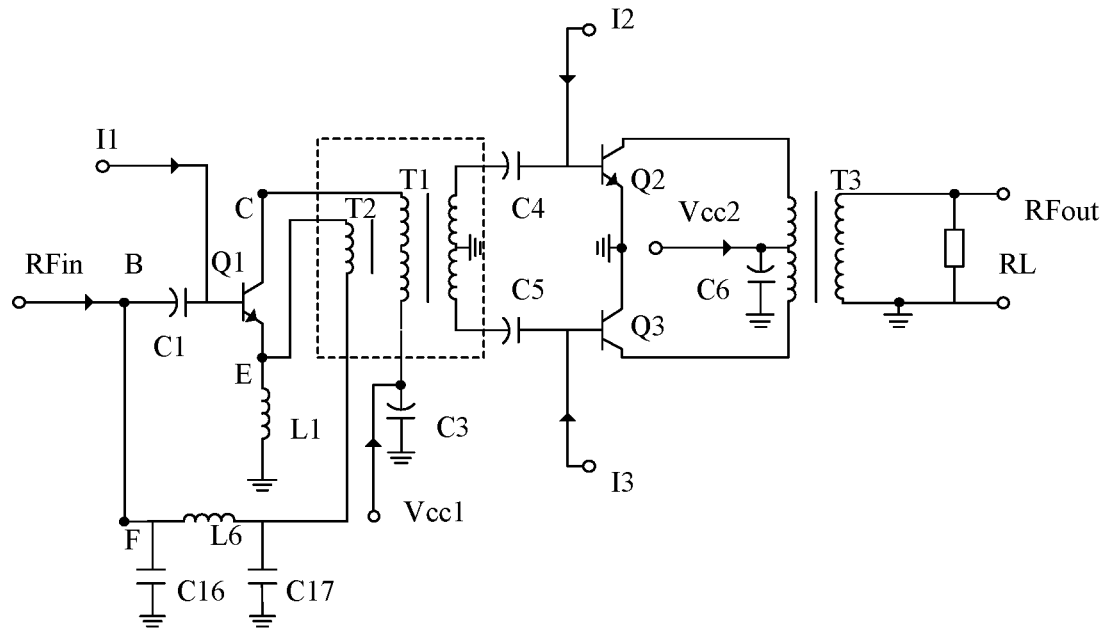
FIG. 6J is a second schematic diagram of a circuit structure in which the feedback device is a pi type filter in an embodiment of the disclosure.

FIG. 6J is the second schematic diagram of a circuit structure in which the feedback device is a pi type filter in an embodiment of the disclosure, and as shown in FIG. 6J, the feedback device is replaced from the feedback coupling capacitor C2 to a pi type filter C16 L6 C17 in this circuit structure diagram based on FIG. 2D.

In an implementation, the secondary coil of a second transformer is directly connected to the ground terminal; or, the secondary coil of a second transformer is connected with the ground terminal through the emitter of a first transistor.

Figure 7A:
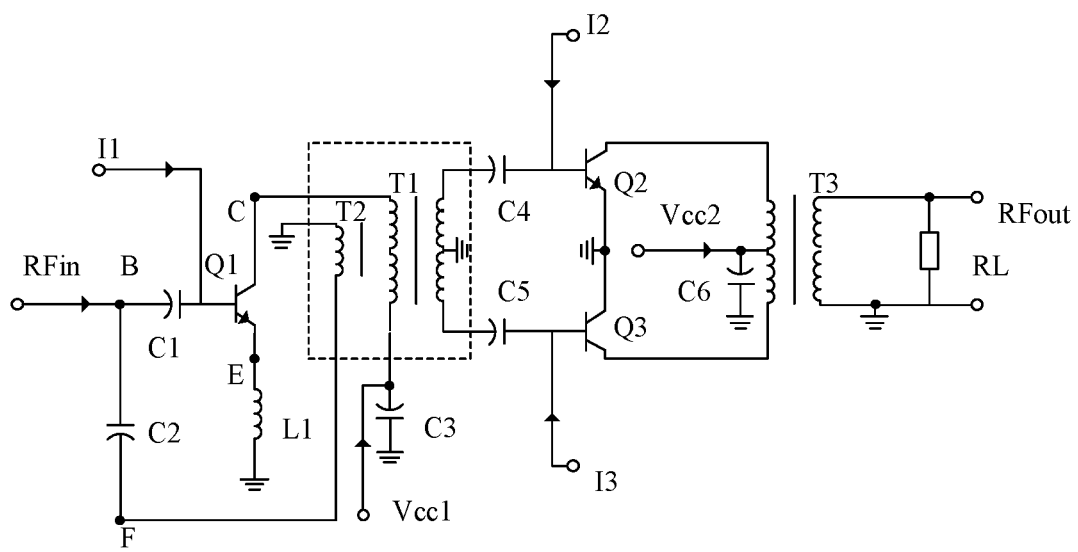
FIG. 7A is a schematic diagram of a circuit structure the secondary coil of a second transformer T2 directly grounded according to an embodiment of the disclosure.
Figure 7B:
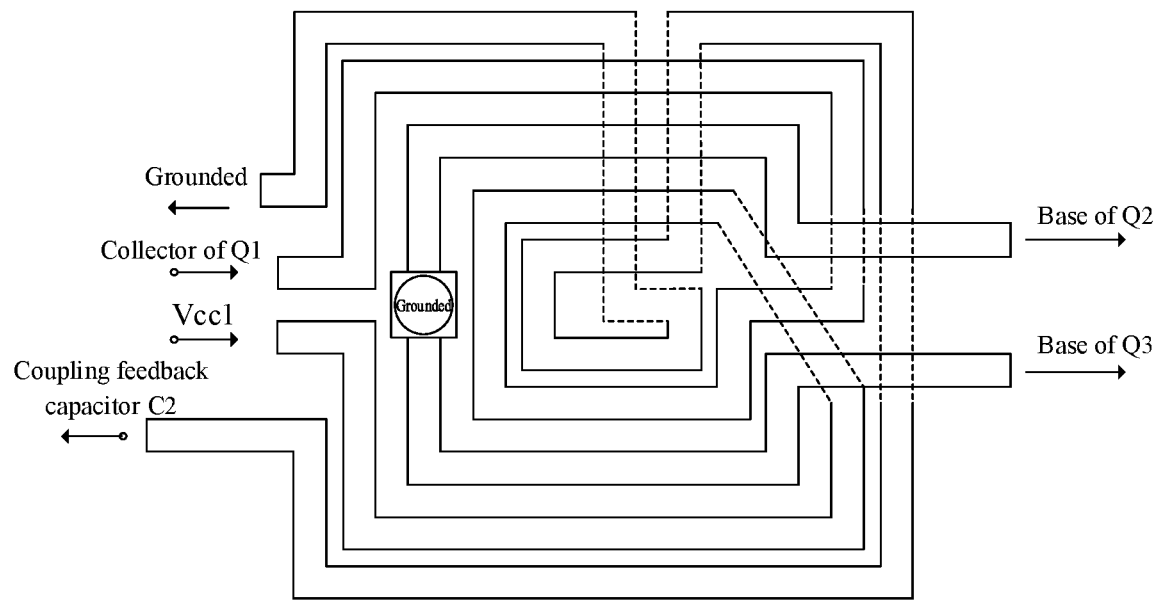
FIG. 7B is a schematic plan diagram of the secondary coil of a second transformer T2 directly grounded according to an embodiment of the disclosure.

In an embodiment of the disclosure, the secondary coil of the second transformer T2 can be grounded in two ways, in which as shown in FIG. 2D, the secondary coil of the second transformer is connected with the ground terminal through the emitter of the first transistor Q1, or connected with the ground directly. FIG. 7A is a schematic diagram of the circuit structure the secondary coil of the second transformer T2 directly connected with the ground according to an embodiment of the disclosure; and FIG. 7B is a schematic plan diagram of the circuit structure the secondary coil of the second transformer T2 is directly connected with the ground according to an embodiment of the disclosure, in which the metal wiring represented by the solid lines is located in the first layer of the metal layers of the substrate, the metal wiring represented by the dashed lines is located in the second layer of the metal layers of the substrate, and the metal layers are connected with each other through metal through holes.

Figure 7C:
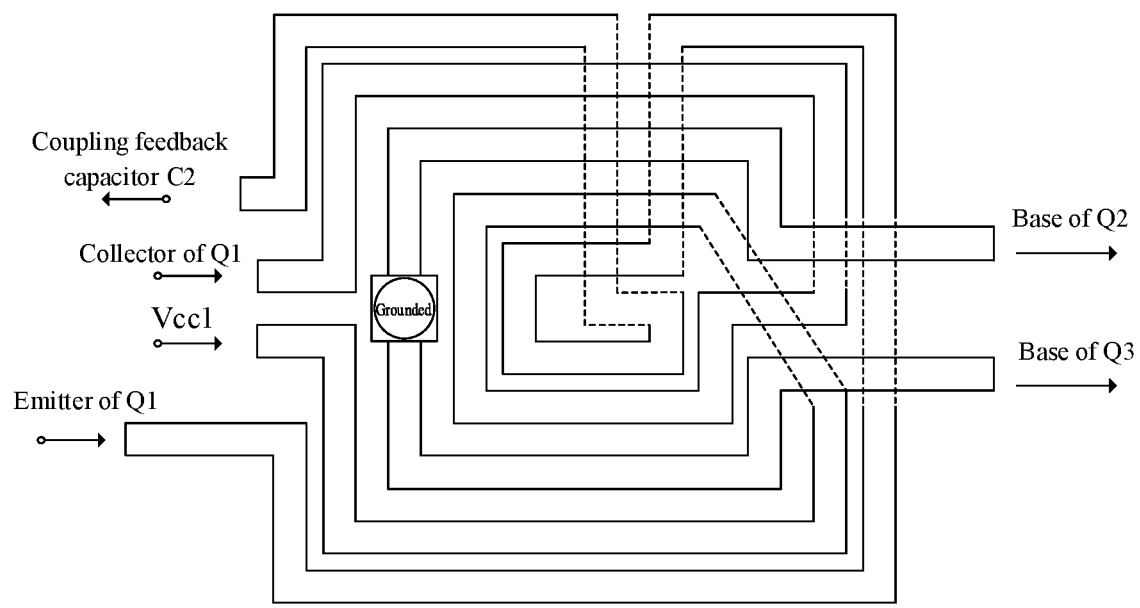
FIG. 7C is a schematic plan diagram of a structure when an output end to an input end is negative feedback in the embodiment of the disclosure.

In an implementation, the coupling feedback circuit is configured to generate the alternating voltage at the input of the first transistor; and when the alternating voltage and the voltage at the input end are in the opposite directions, negative feedback of the input signal at the input end is achieved;

In an embodiment of the disclosure, in the case where the negative pole of the secondary coil of the second transformer T2 is connected with the input end of the first transistor Q1 and the positive pole of the secondary coil of the second transformer T2 is connected with the ground terminal, the alternating voltage generated by the coupling feedback circuit and the voltage at the input end are in the opposite directions, thereby realizing the negative feedback of the input signal at the input end, with which the stability and reliability of radio frequency power amplifier can be improved. FIG. 7C is a schematic plan diagram of a structure when an output end to an input end is negative feedback in the embodiment of the disclosure. The metal wiring represented by the solid lines is located in the first layer of the metal layers of the substrate; the metal wiring represented by the dashed lines is located in the second layer of the metal layers of the substrate; and the metal layers are connected with each other through metal through holes.

Figure 8A:
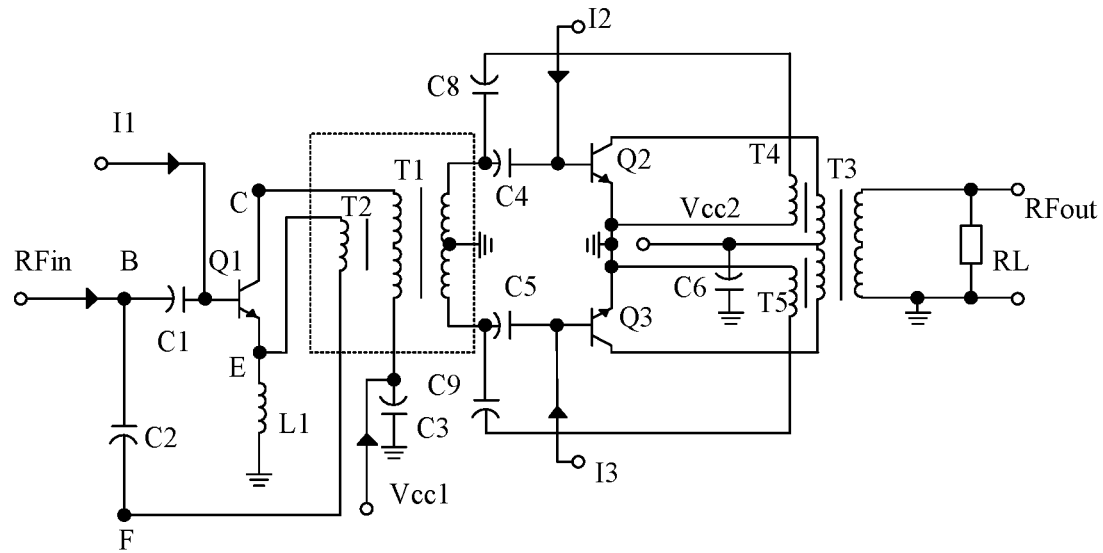
FIG. 8A is a third schematic diagram of a circuit structure of a push-pull radio frequency power amplifier of an embodiment of the disclosure.

FIG. 8A is a third schematic diagram of the circuit structure of a push-pull radio frequency power amplifier of an embodiment of the disclosure, which is illustrated by taking the HBT process as an example. The push-pull radio frequency power amplifier in FIG. 8A is based on the push-pull radio frequency power amplifier in FIG. 2A, and FIG. 8A shows the specific connection relationship among the coupling feedback circuit 20, the drive stage circuit 21 and the power output stage circuit 22, where the coupling feedback circuit 20 is connected to the drive stage circuit 21 and the power output stage circuit 22.

Compared with the push-pull radio frequency power amplifier in FIG. 2D described above, the primary coil of the third transformer is coupled with the secondary coil led out from the base of the second transistor to form a fourth transformer T4; the primary coil of the third transformer is coupled with the secondary coil led out from the base of the third transistor to form a fifth transformer T5; and the coupling feedback circuit includes the secondary coil led out from the base of the second transistor and the secondary coil led out from the base of the third transistor.

In an embodiment of the disclosure, the positive pole of the secondary coil of the fourth transformer T4 is connected with the input end of the second transistor Q2, and the negative pole of the secondary coil of the fourth transformer T4 is connected with the ground terminal; and the positive pole of the secondary coil of the fifth transformer T5 is connected to the input end of the third transistor Q3, and the negative pole of the secondary coil of the fifth transformer T5 is connected to the ground terminal. A tape led out from the middle or other positions of the primary coil of the third transformer T3 is connected with the second direct current power supply Vcc2 to supply power.

As shown in FIG. 8A, the feedback devices included in the coupling feedback circuit 20 are a coupling feedback capacitor C8 and a coupling feedback capacitor C9. One end of the coupling feedback capacitor C8 is configured to receive the alternating voltage generated by the fourth transformer T4, and the other end is connected with the input end of the second transistor Q2; one end of the coupling feedback capacitor C9 is configured to receive the alternating voltage generated by the fifth transformer T5, and the other end is connected to the input end of the third transistor Q3.

Here, the position where the coupling feedback capacitor C8 is connected to the input end of the second transistor Q2 may be in front of or behind the second input matching capacitor C4. Likewise, the position where the coupling feedback capacitor C9 is connected to the input end of the third transistor Q3 may be in front of or behind the third input matching capacitor C5. FIG. 8A shows the case where the coupling feedback capacitor C8 and the coupling feedback capacitor C9 are respectively connected in front of the input matching capacitors.

Figure 8B:
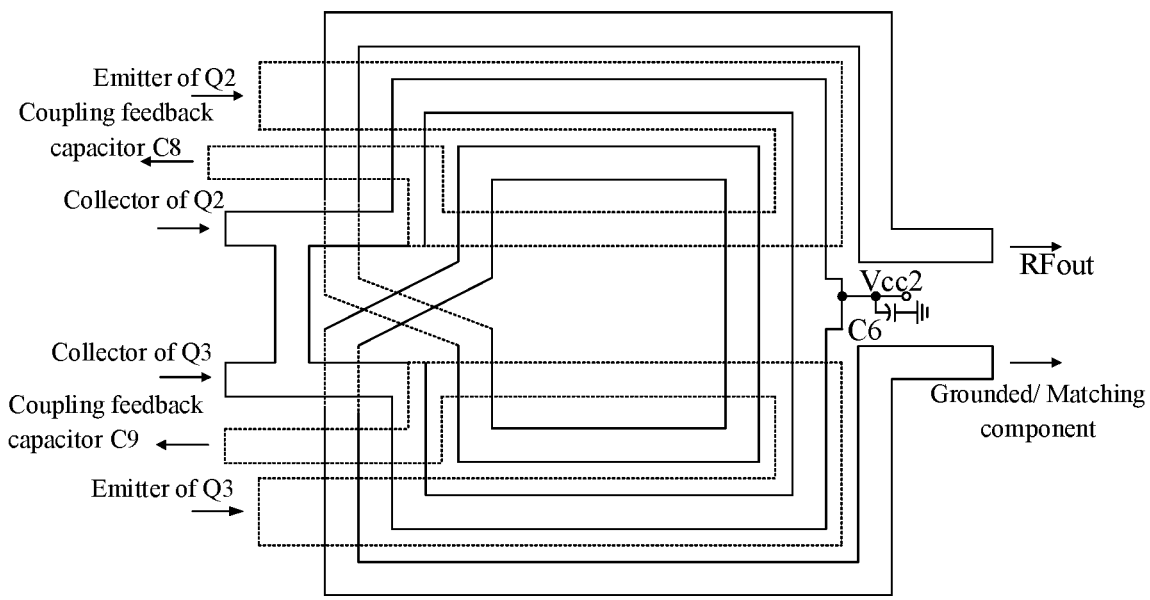
FIG. 8B is a schematic plan diagram of an implementation structure of different transformers in an embodiment of the disclosure.

FIG. 8B is a schematic plan diagram of the implementation structure of different transformers in an embodiment of the disclosure. As shown in FIG. 8B, solid lines indicate the wiring of metal layer 1 and metal ground layer, and dashed lines indicate the wiring of metal layer 2 traces. Metal layers are connected through metal through holes.

In an implementation, the secondary coil of the fourth transformer T4 is directly connected to the ground terminal, or, the secondary coil of the fourth transformer T4 is connected with the ground terminal through the emitter of the second transistor; and the secondary coil of a fifth transformer T5 is directly connected with the ground terminal, or, the secondary coil of a fifth transformer T5 is connected to the ground terminal through the emitter of a third transistor.

Figure 8C:
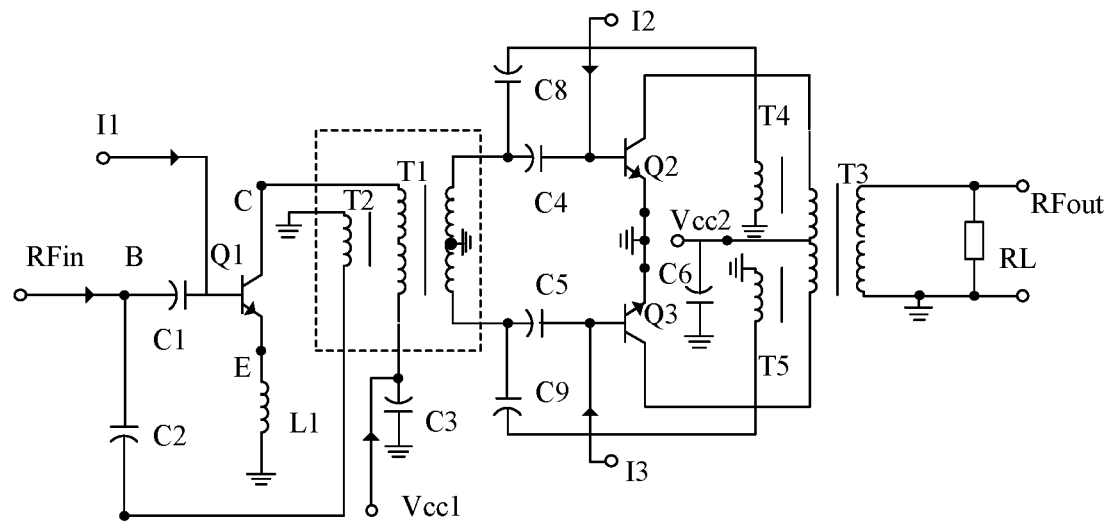
FIG. 8C is a schematic diagram of a circuit structure of the respective secondary coils of a fourth transformer T4 and a fifth transformer T5 are directly connected with ground terminals according to an embodiment of the disclosure.
Figure 8D:
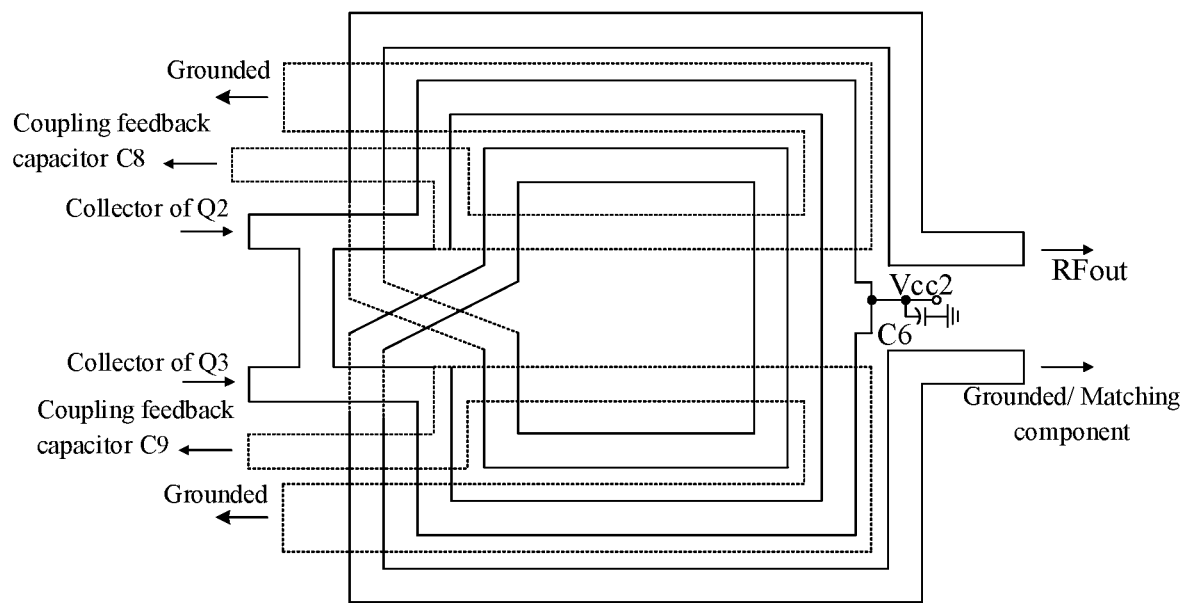
FIG. 8D is a schematic plan diagram of the respective secondary coils of a fourth transformer T4 and a fifth transformer T5 are directly grounded according to an embodiment of the disclosure.

In an embodiment of the disclosure, the secondary coils of a fourth transformer T4 and of a fifth transformer T5 can be grounded in two ways. As shown in FIG. 8A, the secondary coil of the fourth transformer T4 is connected with the ground terminal through the emitter of the second transistor Q2 and the secondary coil of the fifth transformer T5 is connected with the ground terminal through the emitter of the third transistor Q3. The secondary coils of the fourth transformer T4 and of a fifth transformer T5 may also be grounded directly as shown in FIG. 8C. FIG. 8D is a schematic plan diagram of the circuit structure of the secondary coils of a fourth transformer T4 and a fifth transformer T5 are directly connected with the ground according to an embodiment of the disclosure. The metal wiring represented by the solid lines is located in the first layer of the metal layers of the substrate; the metal wiring represented by the dashed lines is located in the second layer of the metal layers of the substrate; and the metal layers are connected with each other through metal through holes.

In an implementation, a coupling feedback circuit 20 further includes a feedback device. One end of the feedback device is configured to receive the alternating voltage, and the other end of the feedback device is connected with the input end of the push-pull transistor.

Here, the coupling feedback circuit 20 is same as those in the embodiments described above and it is not elaborated here.

In an implementation, the coupling feedback circuit is configured to generate the alternating voltage at the input of the push-pull transistor; and when the alternating voltage and the voltage at the input end are in the opposite directions, negative feedback of the input signal at the input end is achieved;

In an embodiment of the disclosure, based on the positive feedback, the direction of the secondary coils in the coupling feedback circuit may be changed; the positive poles of the secondary coils are grounded and the negative poles are connected to the input end of the push-pull transistor; furthermore, the alternating voltage opposite to the voltage at the input end is generated to realize negative feedback of the input signal at the input end. With the negative feedback, the stability and reliability of a radio frequency power amplifier can be improved.

In an implementation, the coupling feedback circuit and the power output stage circuit are located at different metal layers respectively to achieve the interlayer coupling between the surfaces of the different metal layers.

In an embodiment of the disclosure, the secondary coil of the coupling feedback circuit and the primary coil of the power output stage circuit are located in different metal layers to realize interlayer coupling between surfaces of the metal layers. Here, the corresponding substrate laminated layers structure may include two layers of metal wiring or three or more layers of metal wiring. The schematic diagrams of the substrate laminated layers of a fourth transformer T4 and of a fifth transformer T5 are shown in FIG. 5B and FIG. 5C.

The disclosure further provides a method for controlling a circuit, which is applied in a push-pull radio frequency power amplifier which includes: a coupling feedback circuit, a drive stage circuit, and a power output stage circuit, in which the coupling feedback circuit is connected with the driving stage circuit and/or the power output stage circuit, in which, the method includes:

generating an alternating voltage at an input end of a first transistor and/or an input end of a push-pull transistor; in the case where the alternating voltage and a voltage at the input end are in a same direction, a positive feedback of an input signal at the input end is achieved; the first transistor represents a transistor in the drive stage circuit and the push-pull transistor represents a second transistor and a third transistor that form a push-pull structure in the power output stage circuit.

It should be noted that a circuit structure diagram of a push-pull type radio frequency power amplifier proposed in the embodiments of the disclosure is not limited to the circuit structures described in the above embodiments, but also applicable to the circuit structures of other push-pull type RF power amplifiers, which is not limited by the embodiments of the disclosure.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A push-pull radio frequency power amplifier, comprising: a coupling feedback circuit, a drive stage circuit and a power output stage circuit, the coupling feedback circuit being connected with the drive stage circuit and/or the power output stage circuit;
- wherein, the coupling feedback circuit is configured to generate an alternating voltage at an input end of a first transistor and/or an input end of a push-pull transistor; when the alternating voltage and a voltage at the input end are in a same direction, a positive feedback of an input signal at the input end is achieved; the first transistor represents a transistor in the drive stage circuit and the push-pull transistor represents a second transistor and a third transistor that form a push-pull structure in the power output stage circuit;
- wherein the drive stage circuit comprises a first transformer;
- when the first transistor is a heterojunction bipolar transistor HBT, a primary coil of the first transformer is coupled with a secondary coil led out from a base of the first transistor to form a second transformer; and the coupling feedback circuit comprises the secondary coil led out from the base of the first transistor;
- when the first transistor is a metal-oxide semiconductor field effect transistor MOSFET, the primary coil of the first transformer is coupled with a secondary coil led out from a gate of the first transistor to form a second transformer; and the coupling feedback circuit includes the secondary coil led out from the gate of the first transistor.

2. The push-pull radio frequency power amplifier according to claim 1, wherein a secondary coil of the second transformer is directly connected with a ground terminal;
- or when the first transistor is the HBT, the secondary coil of the second transformer is connected with the ground terminal through an emitter of the first transistor;
- or when the first transistor is the MOSFET, the secondary coil of the second transformer is connected with the ground terminal through a source of the first transistor.

3. The push-pull radio frequency power amplifier according to claim 1, wherein the coupling feedback circuit further comprises: a feedback device;
- one end of the feedback device is configured to receive the alternating voltage, and the other end of the feedback device is connected with the input end of the first transistor and/or the input end of the push-pull transistor.

4. The push-pull radio frequency power amplifier according to claim 3, wherein, the feedback device is any one of a coupling feedback capacitor, a variable capacitor, a varactor diode, a resistor-diode series branch, a RC series branch, a resistor and a filter.

5. The push-pull radio frequency power amplifier according to claim 1, wherein, the coupling feedback circuit is configured to generate the alternating voltage at the input end of the first transistor and/or the input end of the push-pull transistor; and when the alternating voltage and the voltage at the input end are in opposite directions, a negative feedback of the input signal at the input end is achieved.

6. The push-pull radio frequency power amplifier according to claim 1, wherein
- when the coupling feedback circuit is connected with the drive stage circuit, the coupling feedback circuit and the drive stage circuit are located at different metal layers respectively to achieve interlayer coupling between surfaces of the different metal layers; and
- when the coupling feedback circuit is connected with the power output stage circuit, the coupling feedback circuit and the power output stage circuit are located at different metal layers respectively to achieve the interlayer coupling between the surfaces of the different metal layers.

7. The push-pull radio frequency power amplifier according to claim 1, wherein the positive feedback of the input signal from the output end to the input end is realized by with the alternating voltage generated by the coupling feedback circuit, and the in-phase superposition of the input signal is carried out according to the positive feedback of the input signal, thereby improving a strength of the input signal without increasing a number of drive stages.

8. A push-pull radio frequency power amplifier, comprising: a coupling feedback circuit, a drive stage circuit and a power output stage circuit, the coupling feedback circuit being connected with the drive stage circuit and/or the power output stage circuit;
- wherein, the coupling feedback circuit is configured to generate an alternating voltage at an input end of a first transistor and/or an input end of a push-pull transistor; when the alternating voltage and a voltage at the input end are in a same direction, a positive feedback of an input signal at the input end is achieved; the first transistor represents a transistor in the drive stage circuit and the push-pull transistor represents a second transistor and a third transistor that form a push-pull structure in the power output stage circuit;
- wherein the power output stage circuit comprises a third transformer;
- when the second transistor and the third transistor are the HBT, a primary coil of the third transformer is coupled with a secondary coil led out from a base of the second transistor to form a fourth transformer; the primary coil of the third transformer is coupled with a secondary coil led out from a base of the third transistor to form a fifth transformer; and the coupling feedback circuit comprises the secondary coil led out from the base of the second transistor and the secondary coil led out from the base of the third transistor;
- when the second transistor and the third transistor are the MOSFETs, the primary coil of the third transformer is coupled with a secondary coil led out from a gate of the second transistor to form a fourth transformer; the primary coil of the third transformer is coupled with a secondary coil led out by a gate of the third transistor to form a fifth transformer; and the coupling feedback circuit comprises the secondary coil led out from the gate of the second transistor and the secondary coil led out from the gate of the third transistor.

9. The push-pull radio frequency power amplifier according to claim 8, wherein a secondary coil of the fourth transformer is connected with the ground terminal;
- or when the second transistor is the HBT, the secondary coil of the fourth transformer is connected with the ground terminal through an emitter of the second transistor;
- or when the second transistor is the MOSFET, the secondary coil of the fourth transformer is connected with the ground terminal through a source of the second transistor; and
- a secondary coil of the fifth transformer is connected with the ground terminal directly;

or when the third transistor is the HBT, the secondary coil of the fifth transformer is connected with the ground terminal through an emitter of the third transistor;

or when the third transistor is the MOSFET, the secondary coil of the fourth transformer is connected with the ground terminal through a source of the third transistor.

10. A method of controlling circuit, which is applied in a push-pull radio frequency power amplifier comprising a coupling feedback circuit, a drive stage circuit and a power output stage circuit, in which the coupling feedback circuit is connected with the driving stage circuit and/or the power output stage circuit; wherein the method comprises:

generating an alternating voltage at an input end of a first transistor and/or an input end of a push-pull transistor;

when the alternating voltage and a voltage at the input end are in a same direction, a positive feedback of an input signal at the input end is achieved, in which the first transistor represents a transistor in the drive stage circuit and the push-pull transistor represents a second transistor and a third transistor that form a push-pull structure in the power output stage circuit;

wherein when the coupling feedback circuit is connected with the drive stage circuit, the coupling feedback circuit and the drive stage circuit are located at different metal layers respectively to achieve interlayer coupling between surfaces of the different metal layers; and when the coupling feedback circuit is connected with the power output stage circuit, the coupling feedback circuit and the power output stage circuit are located at different metal layers respectively to achieve the interlayer coupling between the surfaces of the different metal layers.

11. The method of claim 10, wherein the drive stage circuit comprises a first transformer;

when the first transistor is a heterojunction bipolar transistor HBT, a primary coil of the first transformer is coupled with a secondary coil led out from a base of the first transistor to form a second transformer; and the coupling feedback circuit comprises the secondary coil led out from the base of the first transistor;

when the first transistor is a metal-oxide semiconductor field effect transistor MOSFET, the primary coil of the first transformer is coupled with a secondary coil led out from a gate of the first transistor to form a second transformer; and the coupling feedback circuit includes the secondary coil led out from the gate of the first transistor.

12. The method of claim 10, wherein the coupling feedback circuit is configured to generate the alternating voltage at the input end of the first transistor and/or the input end of the push-pull transistor; and when the alternating voltage and the voltage at the input end are in opposite directions, a negative feedback of the input signal at the input end is achieved.

13. The method of claim 10, wherein the positive feedback of the input signal from the output end to the input end is realized by with the alternating voltage generated by the coupling feedback circuit, and the in-phase superposition of the input signal is carried out according to the positive feedback of the input signal, thereby improving a strength of the input signal without increasing a number of drive stages.

* * * * *